United States Patent
Mani

(10) Patent No.: US 9,318,180 B2
(45) Date of Patent: Apr. 19, 2016

(54) MRAM WTIH METAL GATE WRITE CONDUCTORS

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

(21) Appl. No.: 14/282,497

(22) Filed: May 20, 2014

(65) Prior Publication Data

US 2014/0254255 A1    Sep. 11, 2014

Related U.S. Application Data

(63) Continuation of application No. 13/311,470, filed on Dec. 5, 2011, now Pat. No. 8,730,719.

(60) Provisional application No. 61/419,403, filed on Dec. 3, 2010.

(51) Int. Cl.
```
G11C 11/14      (2006.01)
G11C 11/16      (2006.01)
H01L 27/22      (2006.01)
```

(52) U.S. Cl.
CPC .......... G11C 11/1675 (2013.01); G11C 11/16 (2013.01); G11C 11/161 (2013.01); H01L 27/228 (2013.01)

(58) Field of Classification Search
CPC . G11C 11/1675; G11C 11/161; H01L 27/228
USPC ......................................... 365/171, 158, 173
See application file for complete search history.

(56) References Cited

U.S. PATENT DOCUMENTS

| | | | |
|---|---|---|---|
| 6,490,217 B1 * | 12/2002 | DeBrosse | G11C 11/15 365/225.5 |
| 6,674,663 B2 * | 1/2004 | Okazawa | G11C 7/12 365/158 |
| 6,711,053 B1 * | 3/2004 | Tang | G11C 11/16 365/158 |
| 6,778,429 B1 * | 8/2004 | Lu | G11C 11/16 365/158 |
| 6,781,874 B2 | 8/2004 | Hidaka | |
| 6,842,367 B2 | 1/2005 | Hidaka | |
| 6,856,537 B2 | 2/2005 | Tanizaki et al. | |
| 6,870,757 B2 * | 3/2005 | Hidaka | G11C 11/15 365/158 |
| 6,882,563 B2 * | 4/2005 | Asao | B82Y 10/00 257/E21.665 |
| 6,900,490 B2 | 5/2005 | Asao et al. | |
| 6,922,355 B2 | 7/2005 | Hidaka | |
| 6,940,749 B2 * | 9/2005 | Tsang | G11C 7/18 365/171 |
| 6,954,374 B2 | 10/2005 | Hidaka | |
| 6,982,902 B2 * | 1/2006 | Gogl | G11C 11/15 365/158 |
| 6,984,865 B2 | 1/2006 | Kajiyama et al. | |
| 7,068,533 B2 * | 6/2006 | Ferrant | G11C 11/15 365/158 |
| 7,095,071 B2 | 8/2006 | Fukuzumi et al. | |
| 7,142,447 B2 | 11/2006 | Ueda et al. | |

(Continued)

*Primary Examiner* — Viet Q Nguyen
(74) *Attorney, Agent, or Firm* — McAndrews, Held & Malloy, Ltd.

(57) ABSTRACT

In one embodiment of the invention, there is provided a magnetic random access (MRAM) device. The device comprises a plurality of MRAM cells, wherein each MRAM cell comprises a magnetic bit, and write conductors defined by conductors patterned in a second metal layer above the magnetic bit; and a gate formed below the magnetic bit between a source and a drain; and addressing circuits to address the MRAM cells.

11 Claims, 30 Drawing Sheets

(56) References Cited

U.S. PATENT DOCUMENTS

| | | | |
|---|---|---|---|
| 7,184,302 B2* | 2/2007 | Yang | G11C 11/15 365/158 |
| 7,203,129 B2* | 4/2007 | Lin | G11C 11/16 365/171 |
| 7,209,383 B2* | 4/2007 | Dray | G11C 7/12 365/171 |
| 7,262,449 B2 | 8/2007 | Kajiyama | |
| 7,372,118 B2 | 5/2008 | Asao et al. | |
| 7,480,172 B2* | 1/2009 | Shi | G11C 11/16 365/158 |
| 7,706,175 B2 | 4/2010 | Hosotani et al. | |
| 7,715,224 B2* | 5/2010 | Min | G11C 11/16 365/158 |
| 7,782,661 B2* | 8/2010 | Yang | G11C 11/16 365/158 |
| 7,881,098 B2 | 2/2011 | Xi et al. | |
| 8,102,700 B2* | 1/2012 | Liu | G11C 11/16 257/421 |
| 8,120,950 B2 | 2/2012 | Fukami et al. | |
| 8,295,082 B2* | 10/2012 | Chua-Eoan | G11C 11/16 329/39 |
| 8,618,614 B2* | 12/2013 | Scheuerlein | G11C 13/0002 257/390 |
| 8,941,197 B2* | 1/2015 | Kajiyama | G11C 11/16 257/427 |
| 9,047,966 B2* | 6/2015 | Lee | G11C 7/1054 |

* cited by examiner

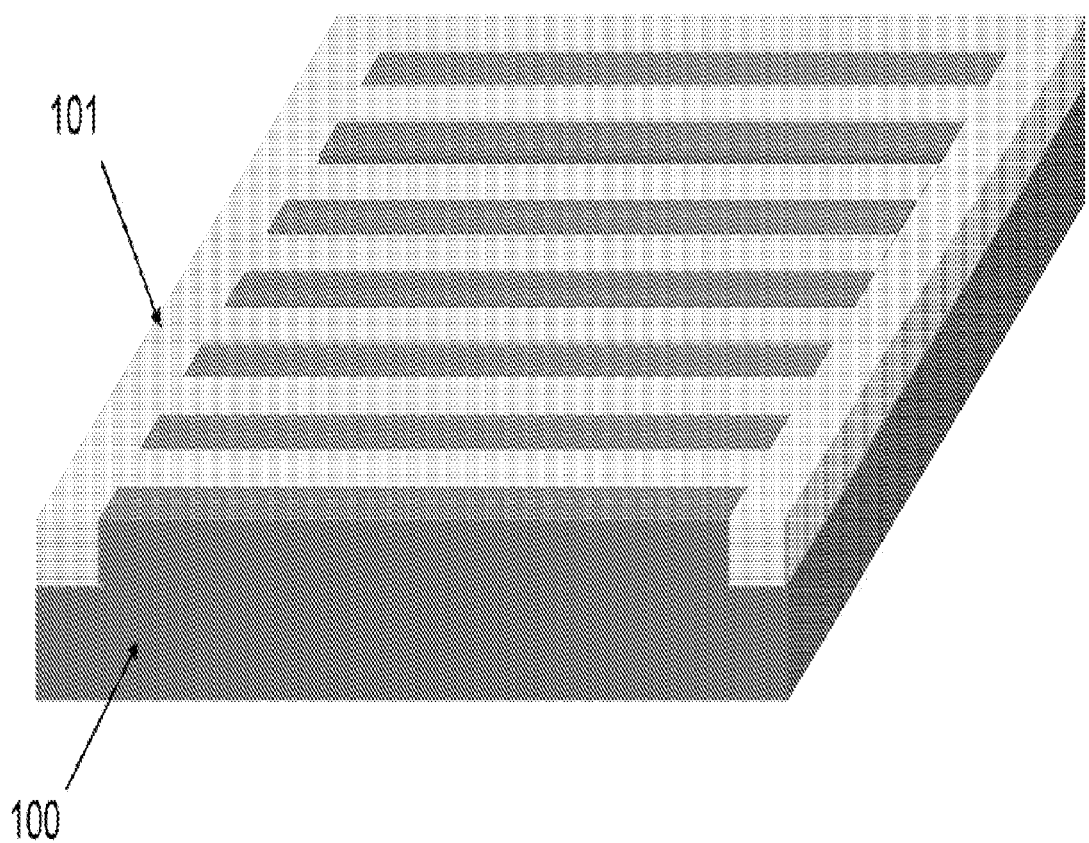
FIG 1.1

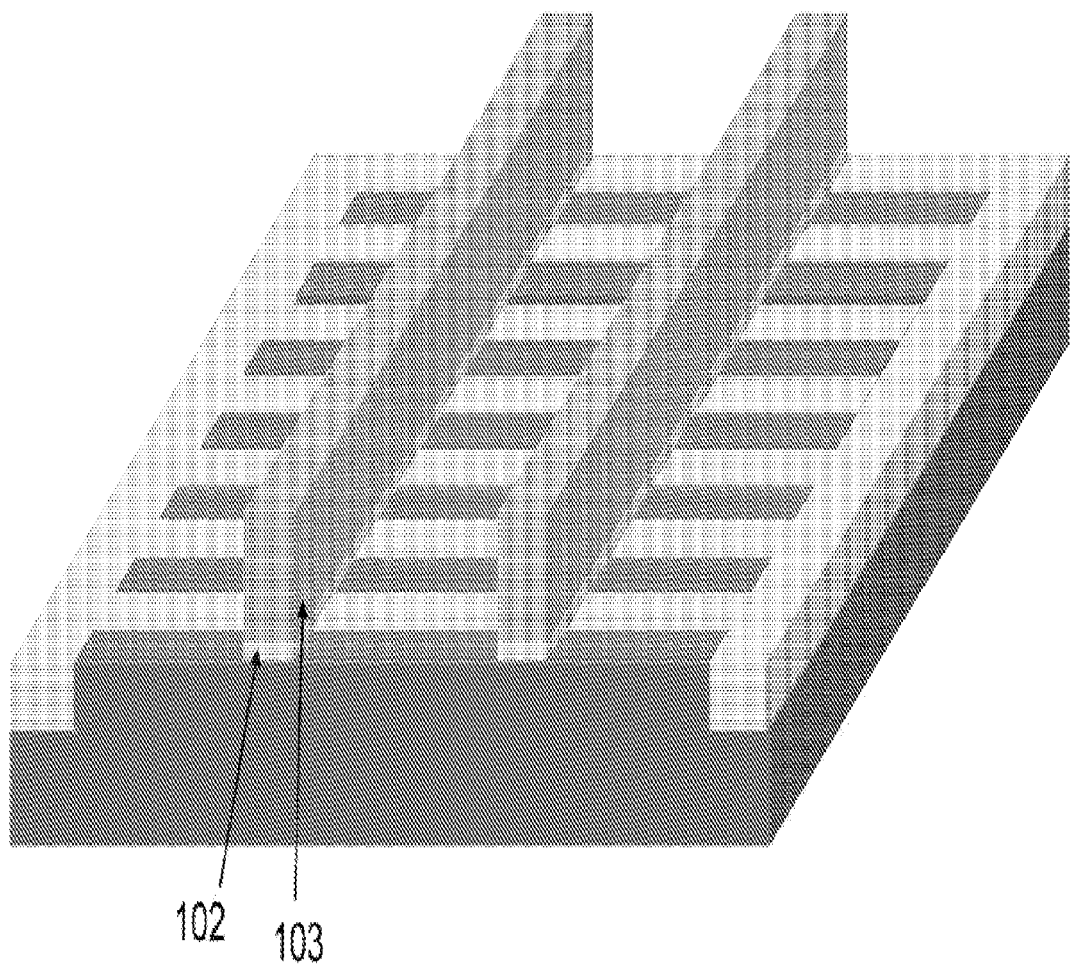
FIG 1.2

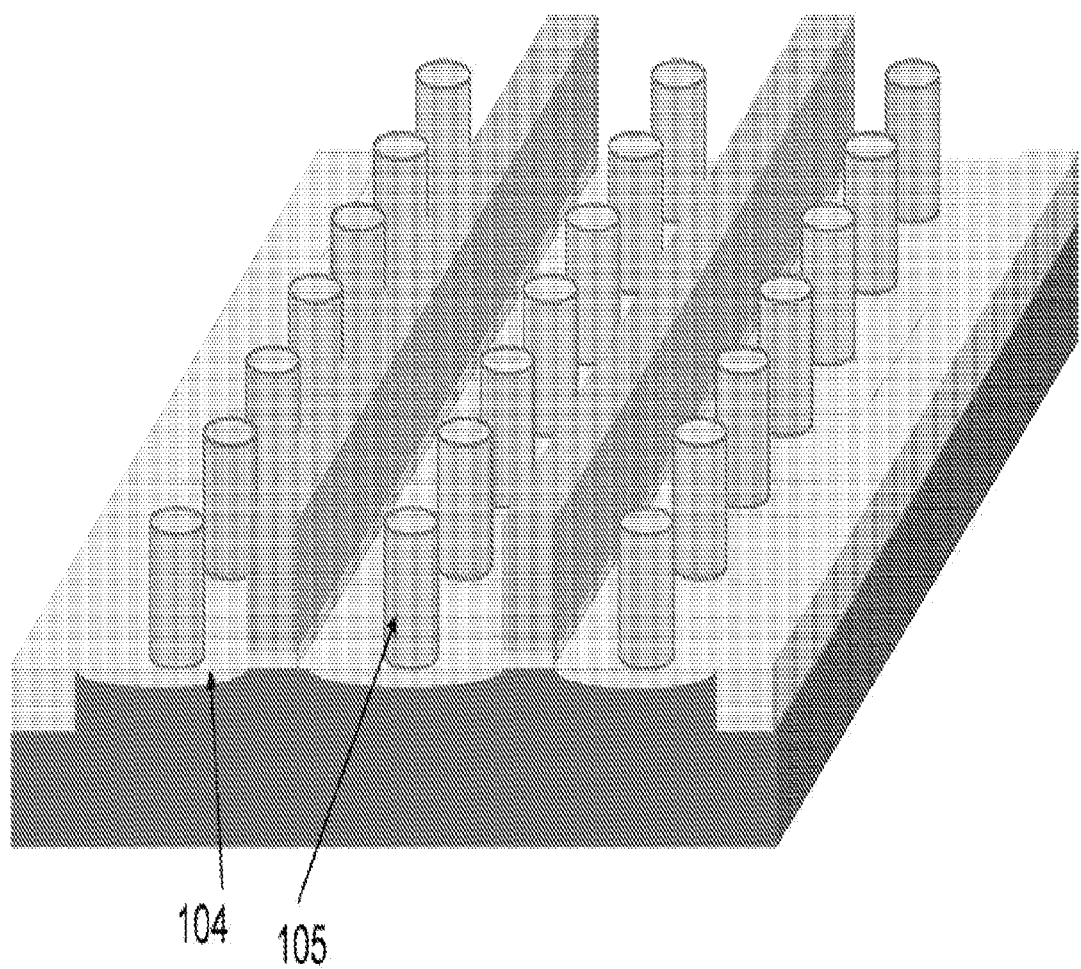
FIG 1.3

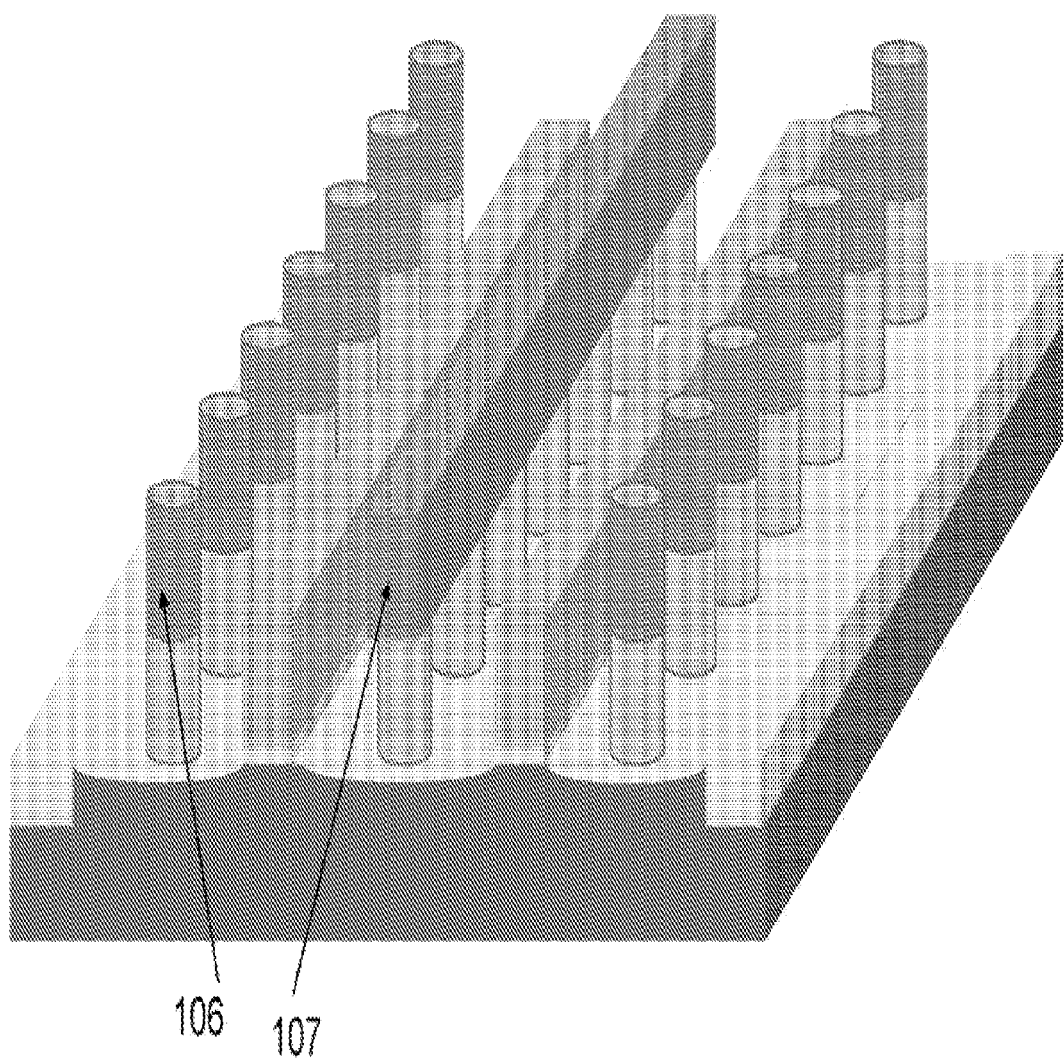
FIG 1.4

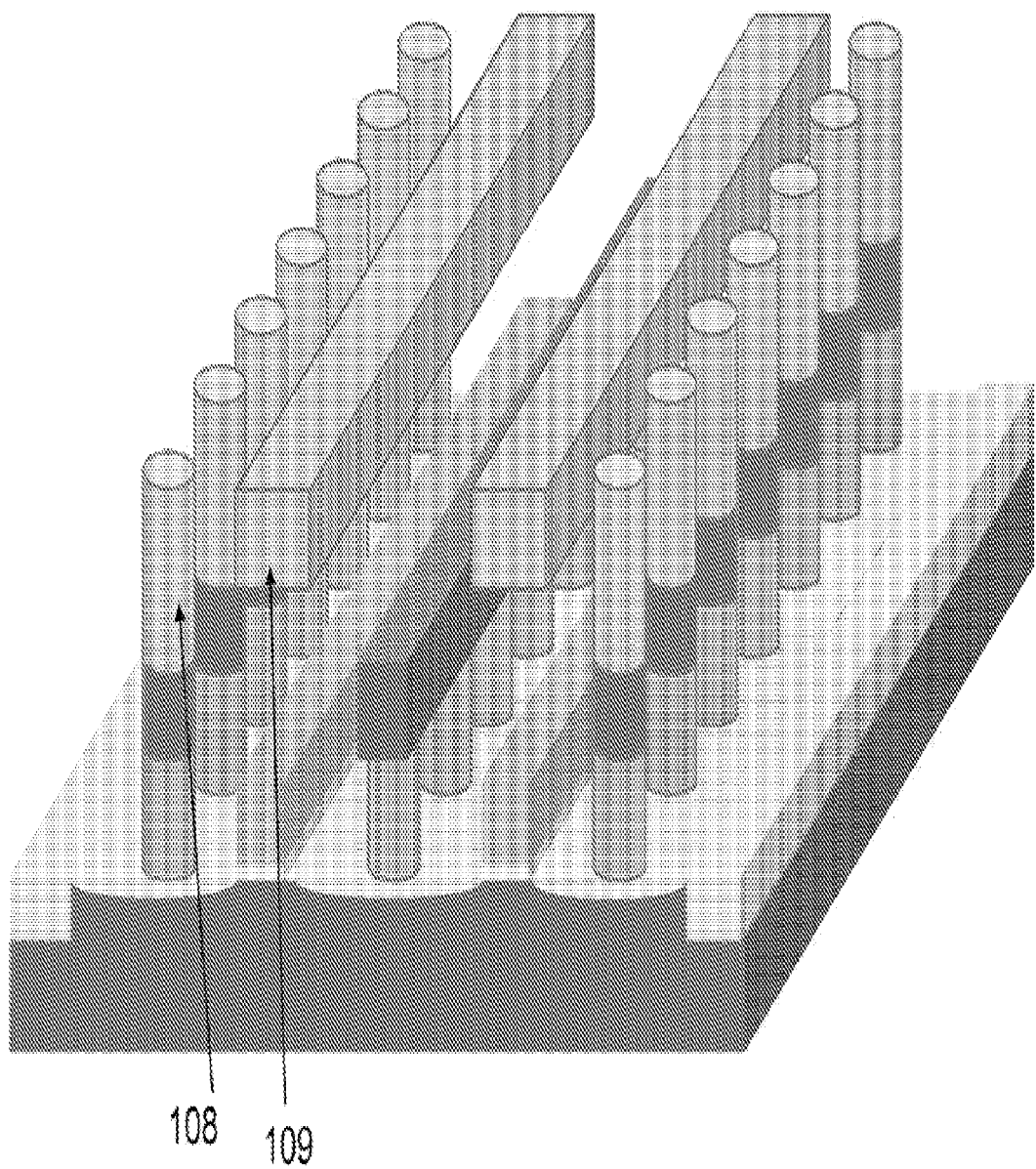
FIG 1.5

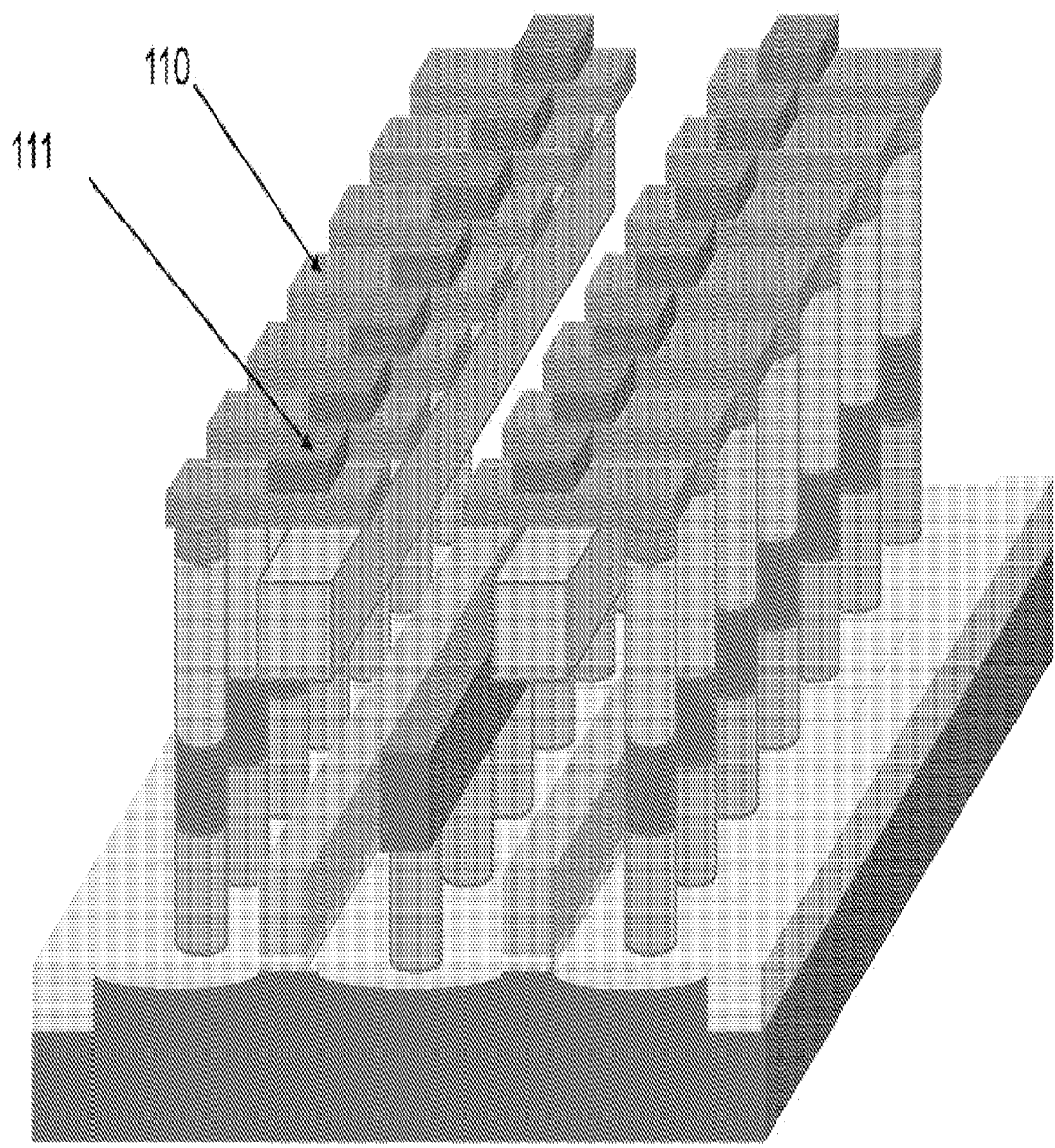
FIG 1.6

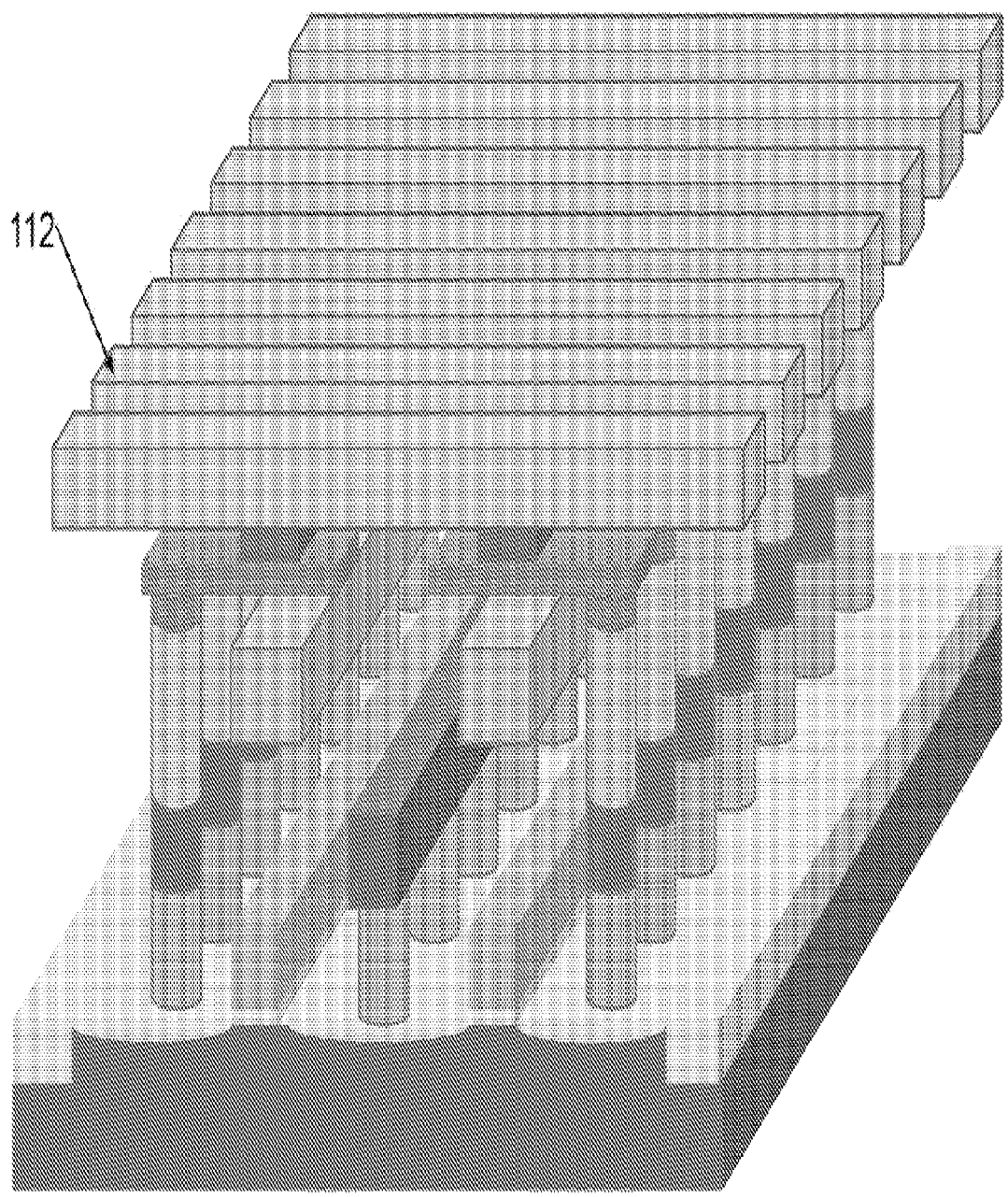
FIG 1.7

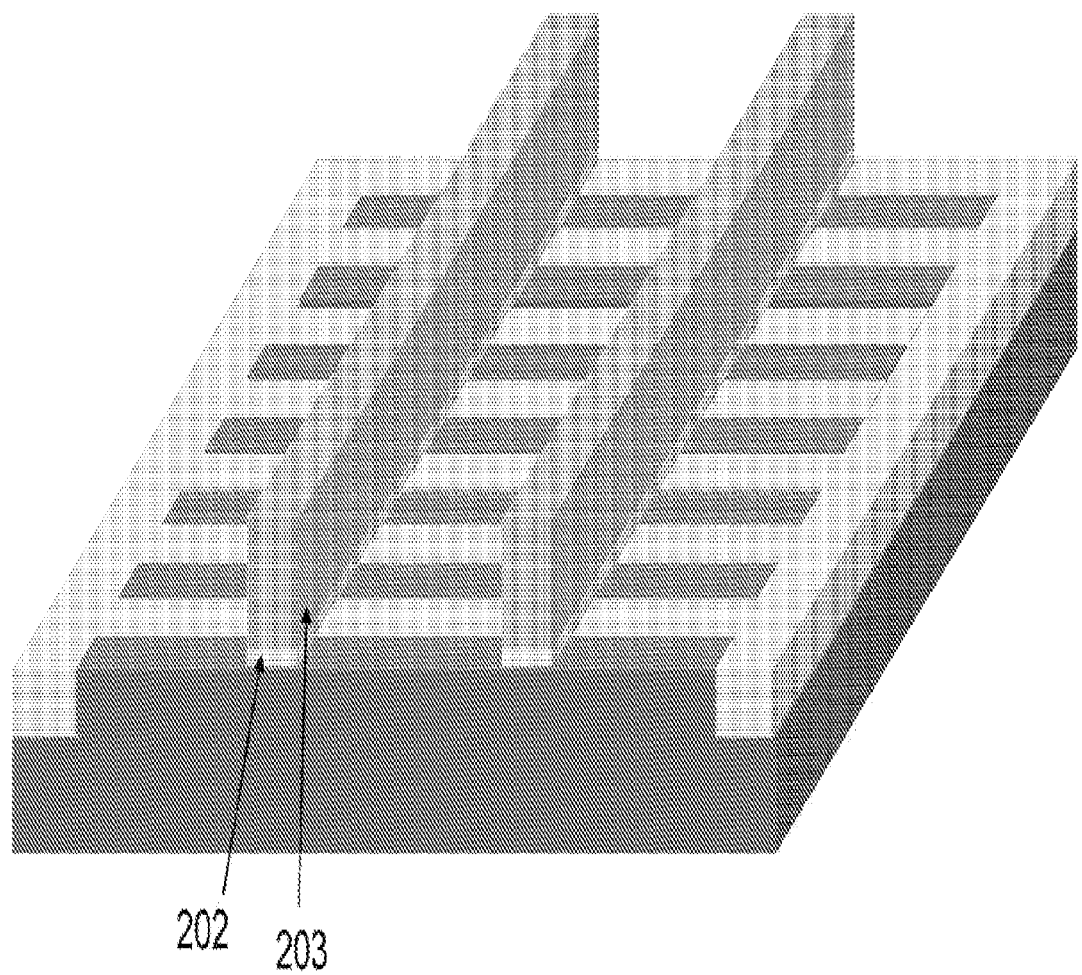
FIG 2.1

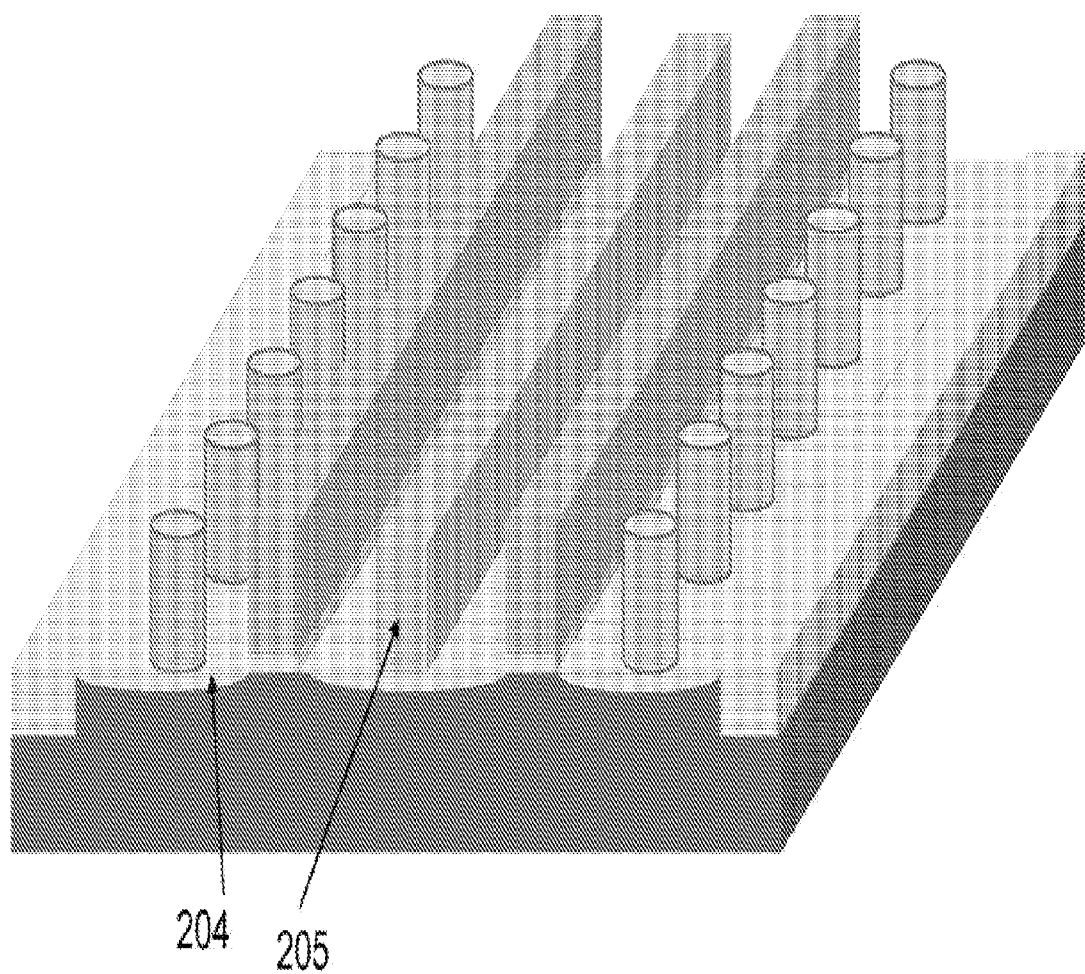
FIG 2.2

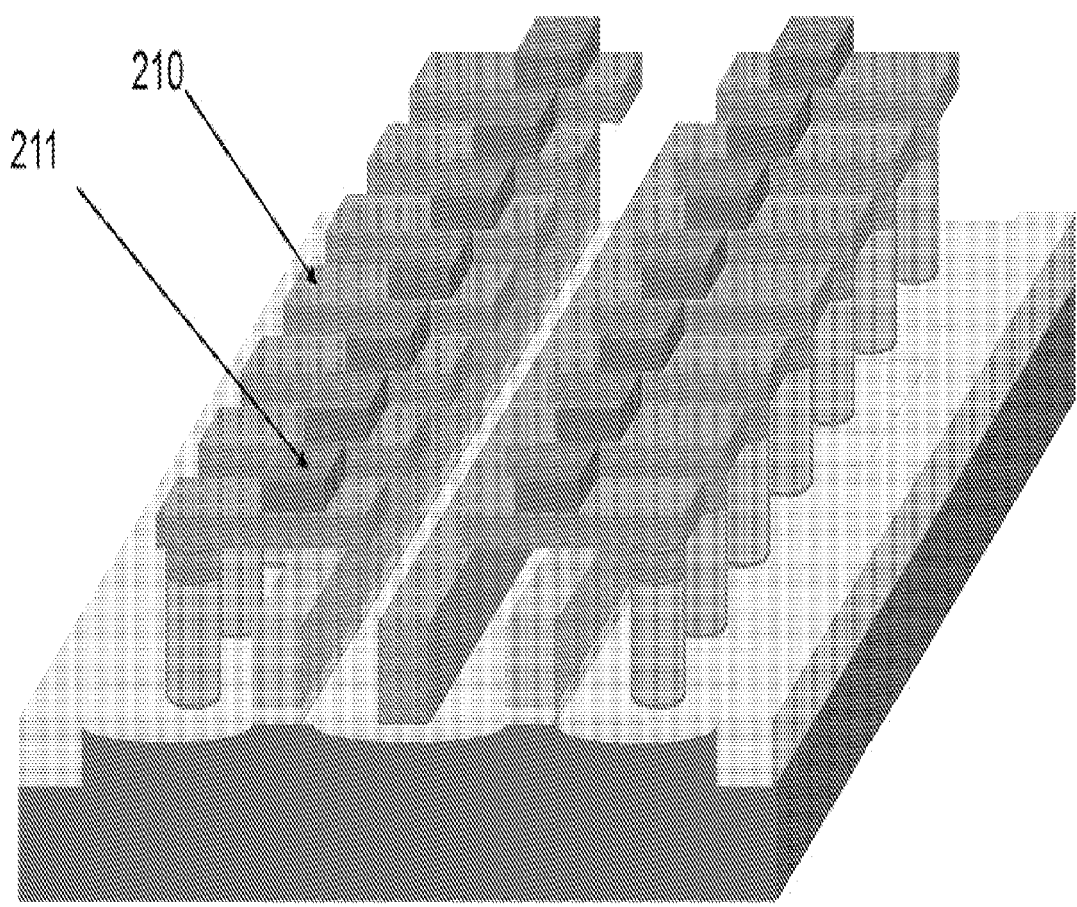
FIG 2.3

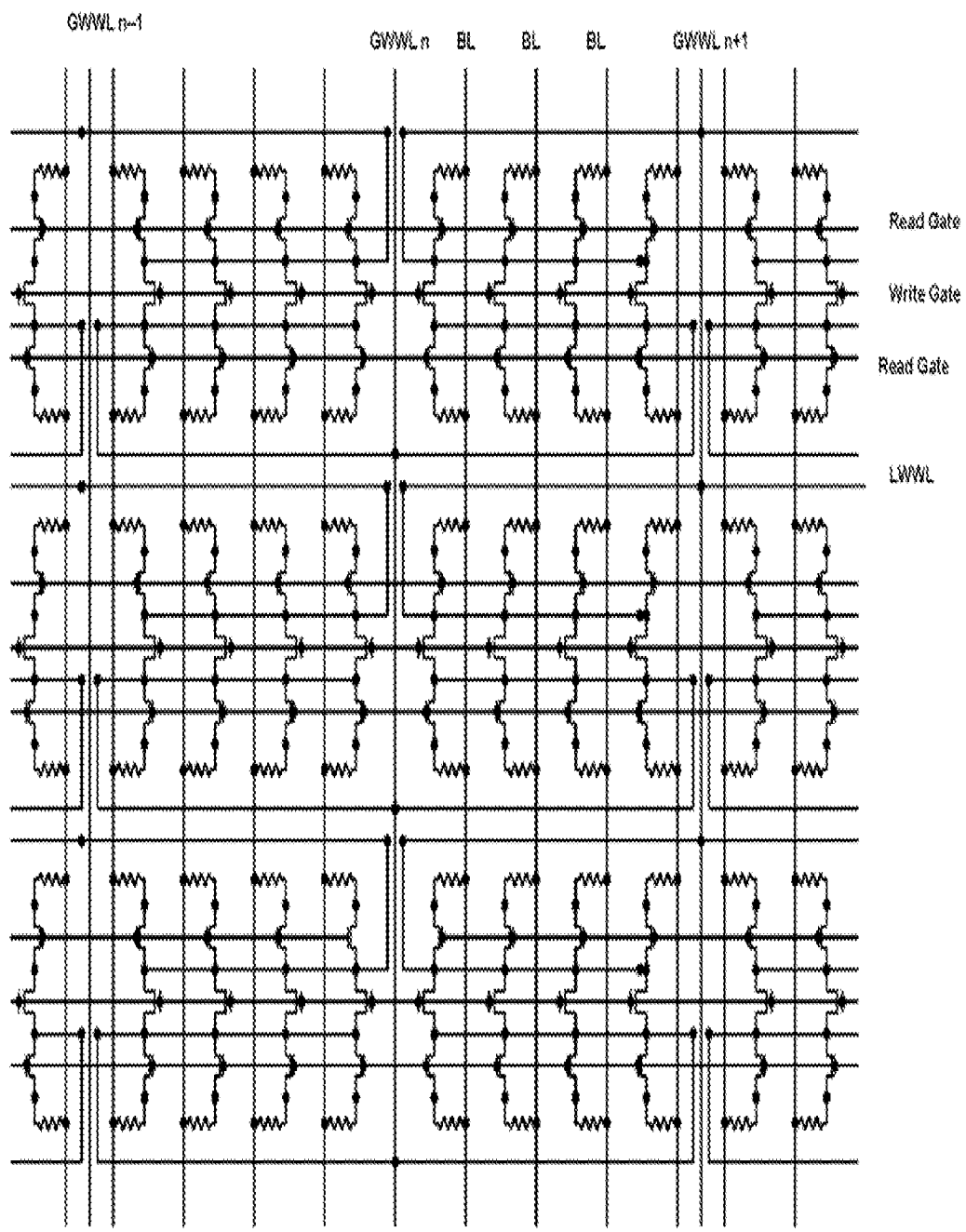
Fig 3.1

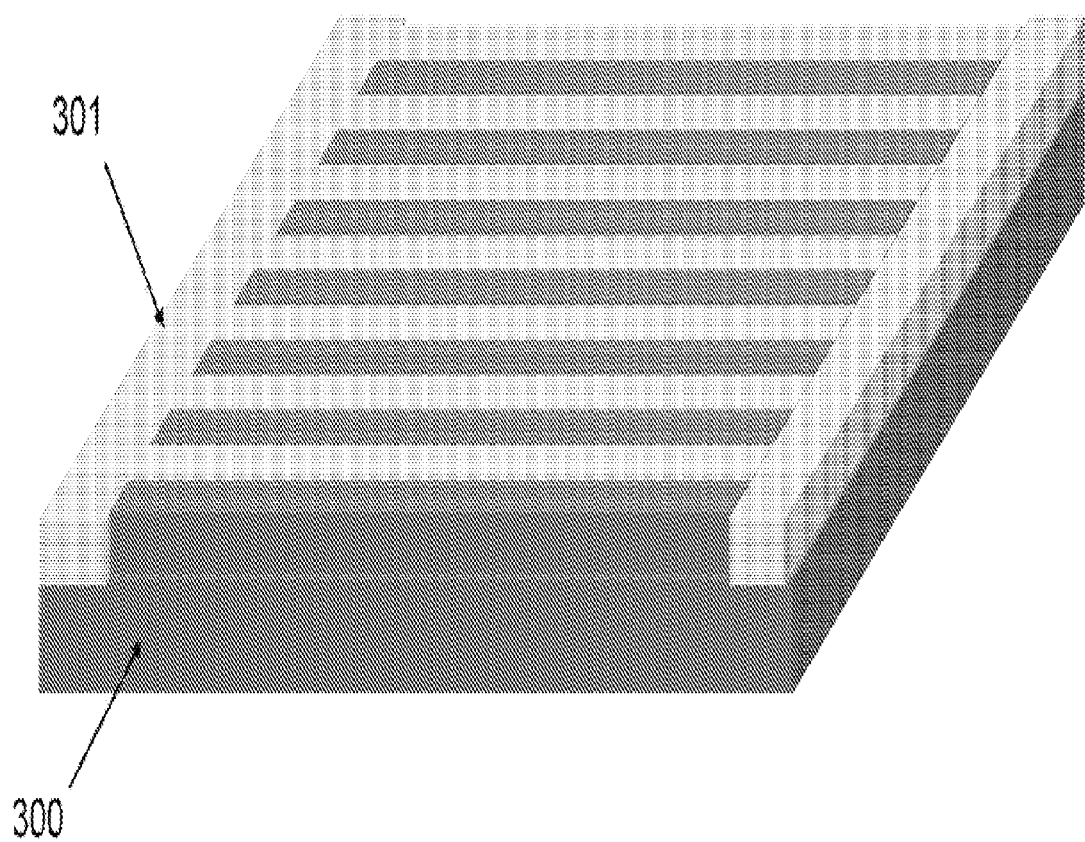
FIG 3.2

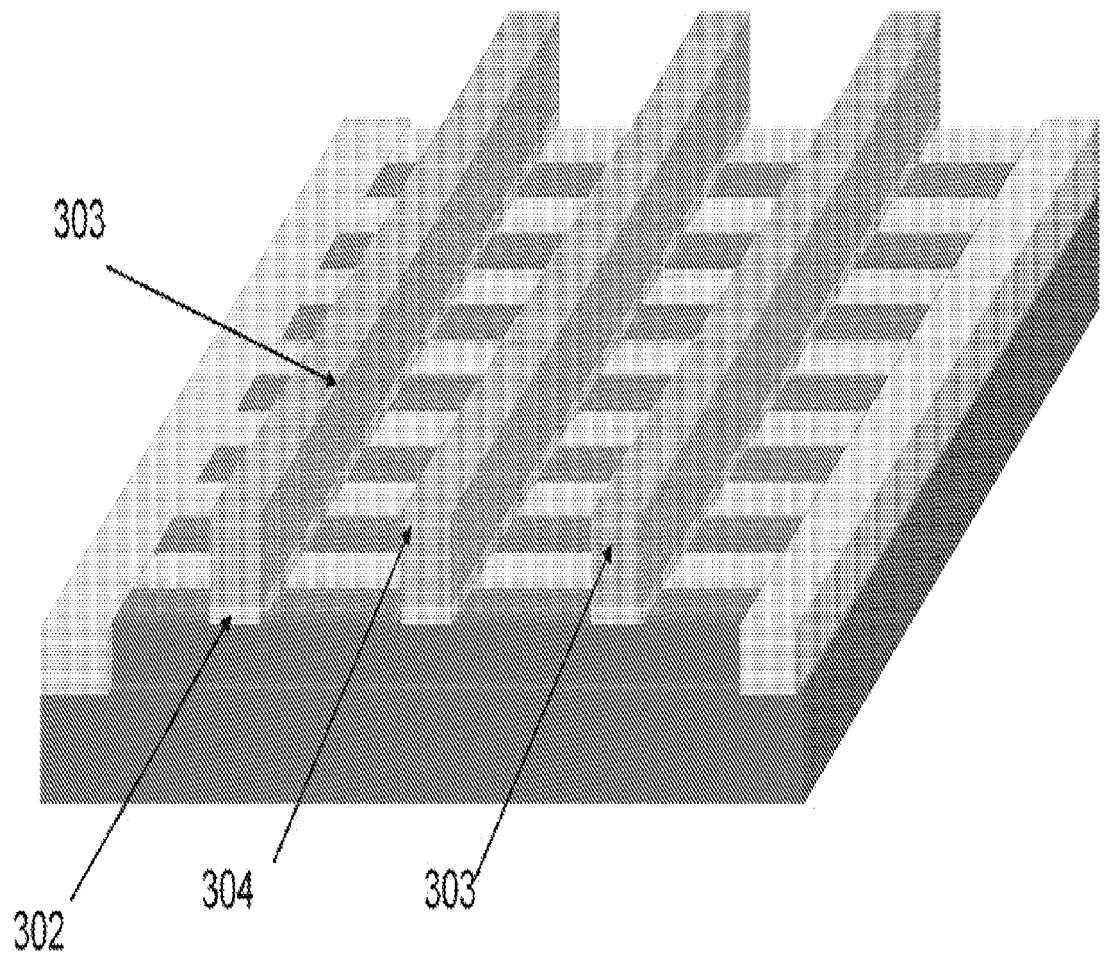
FIG 3.3

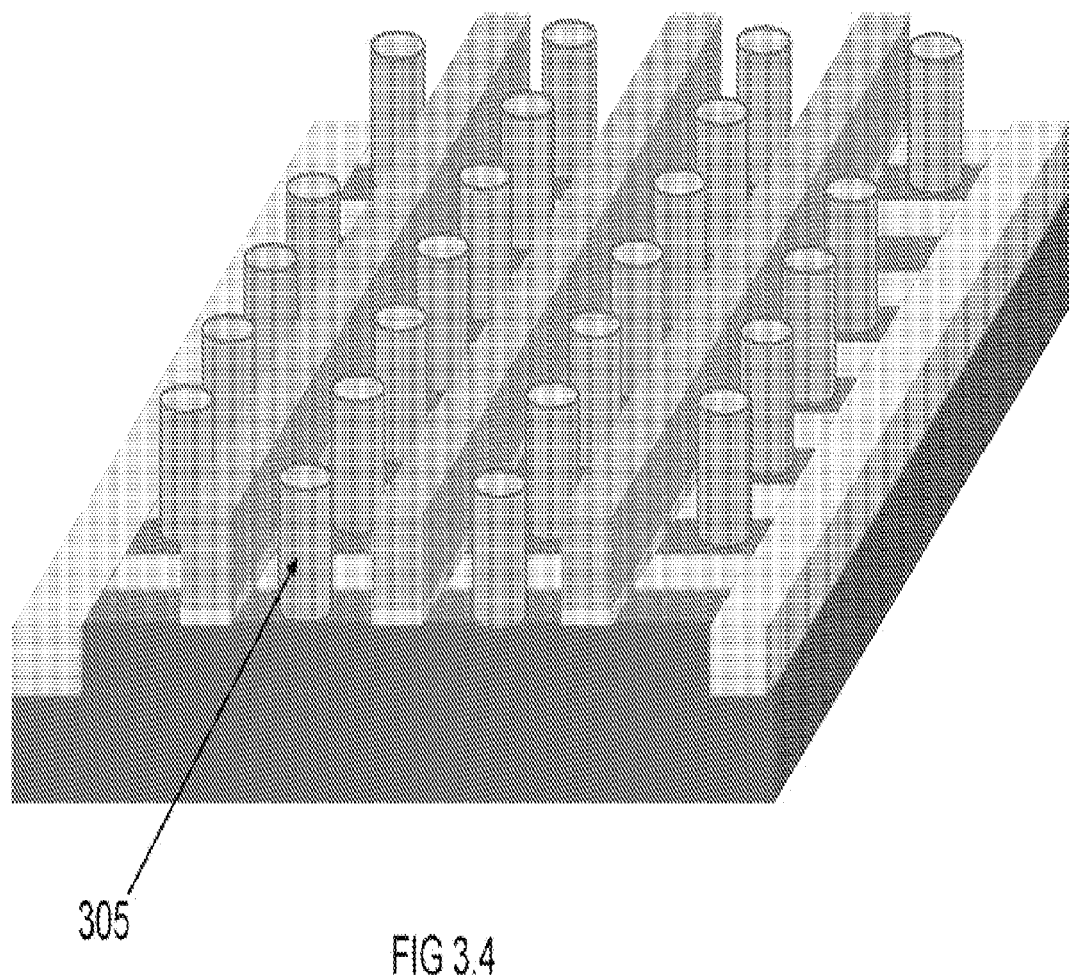
FIG 3.4

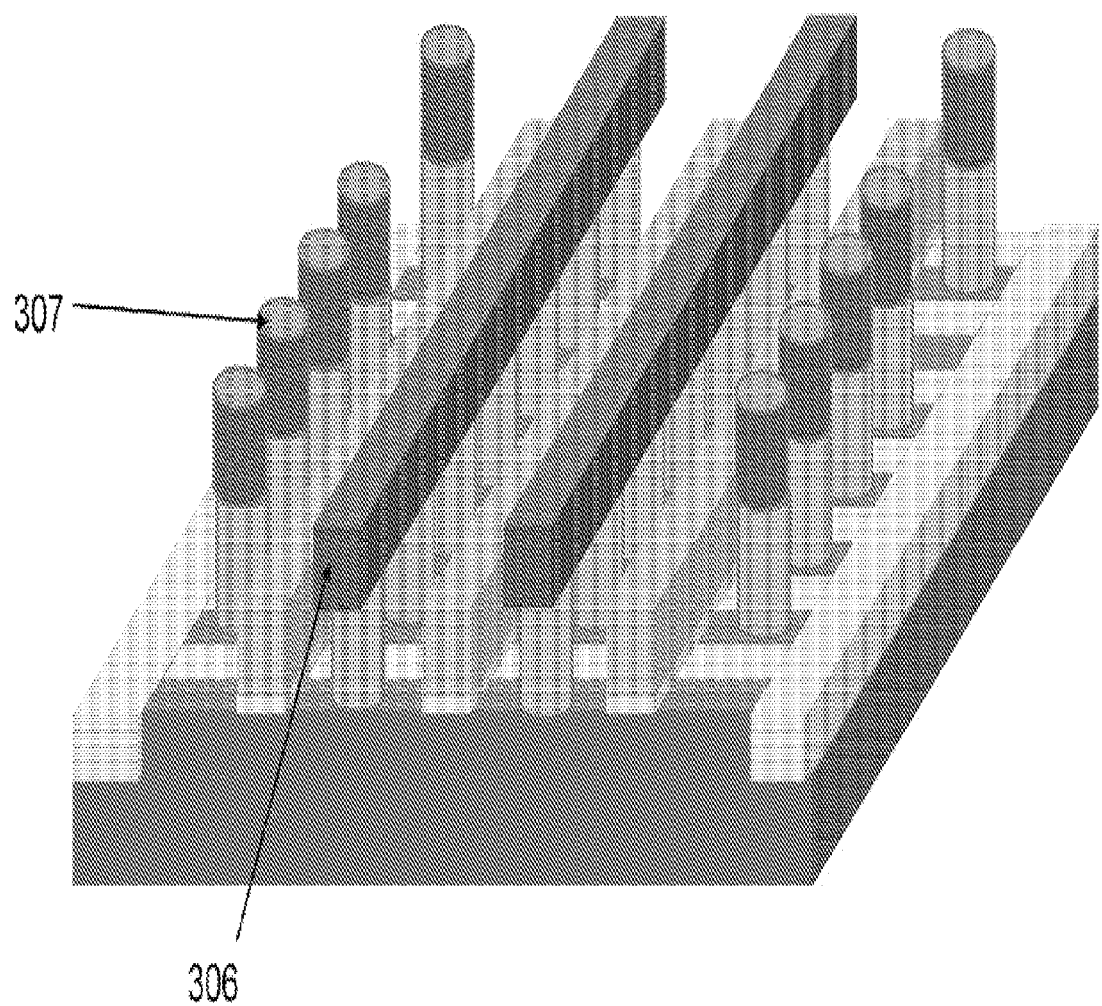
FIG 3.5

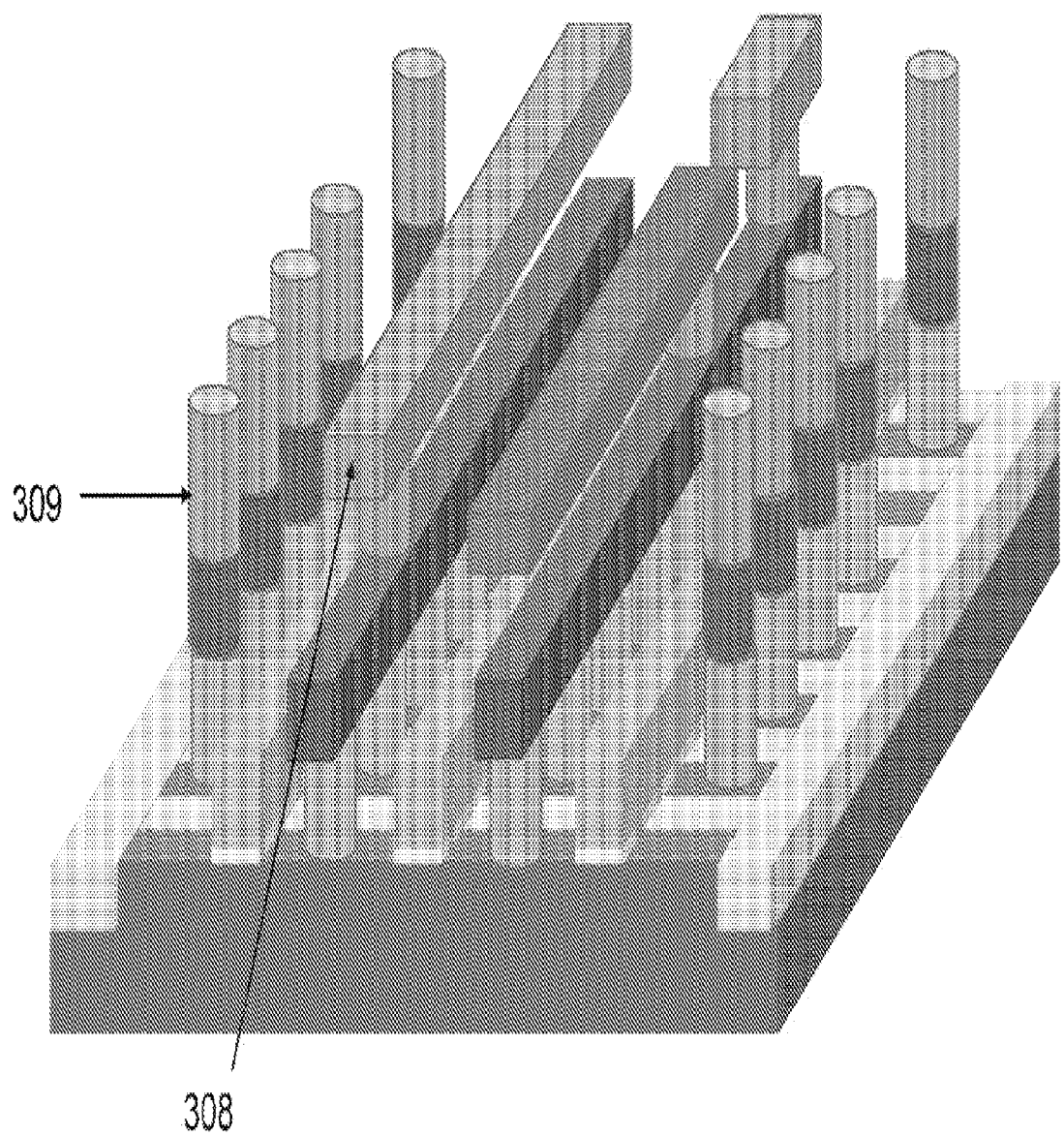
FIG 3.6

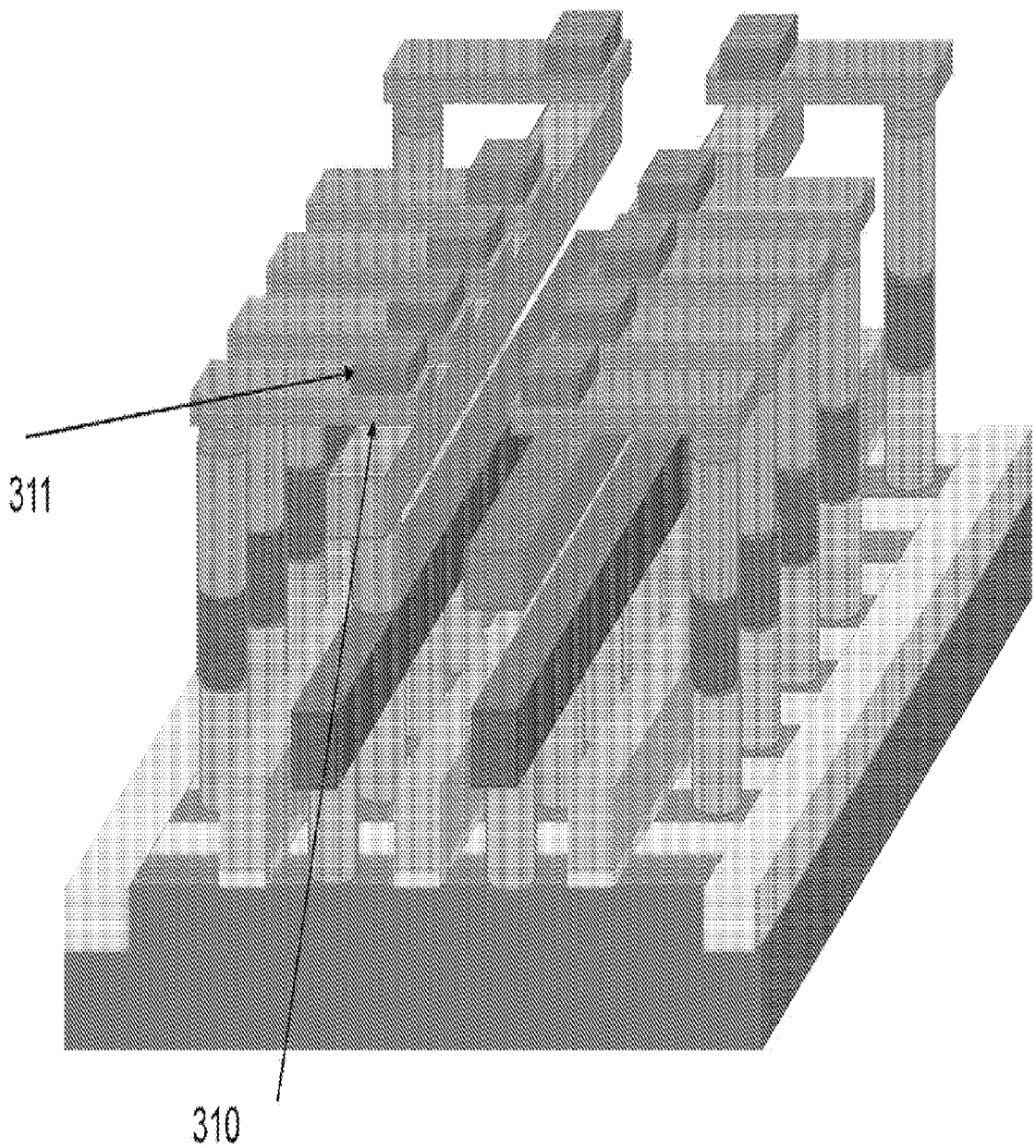
FIG 3.7

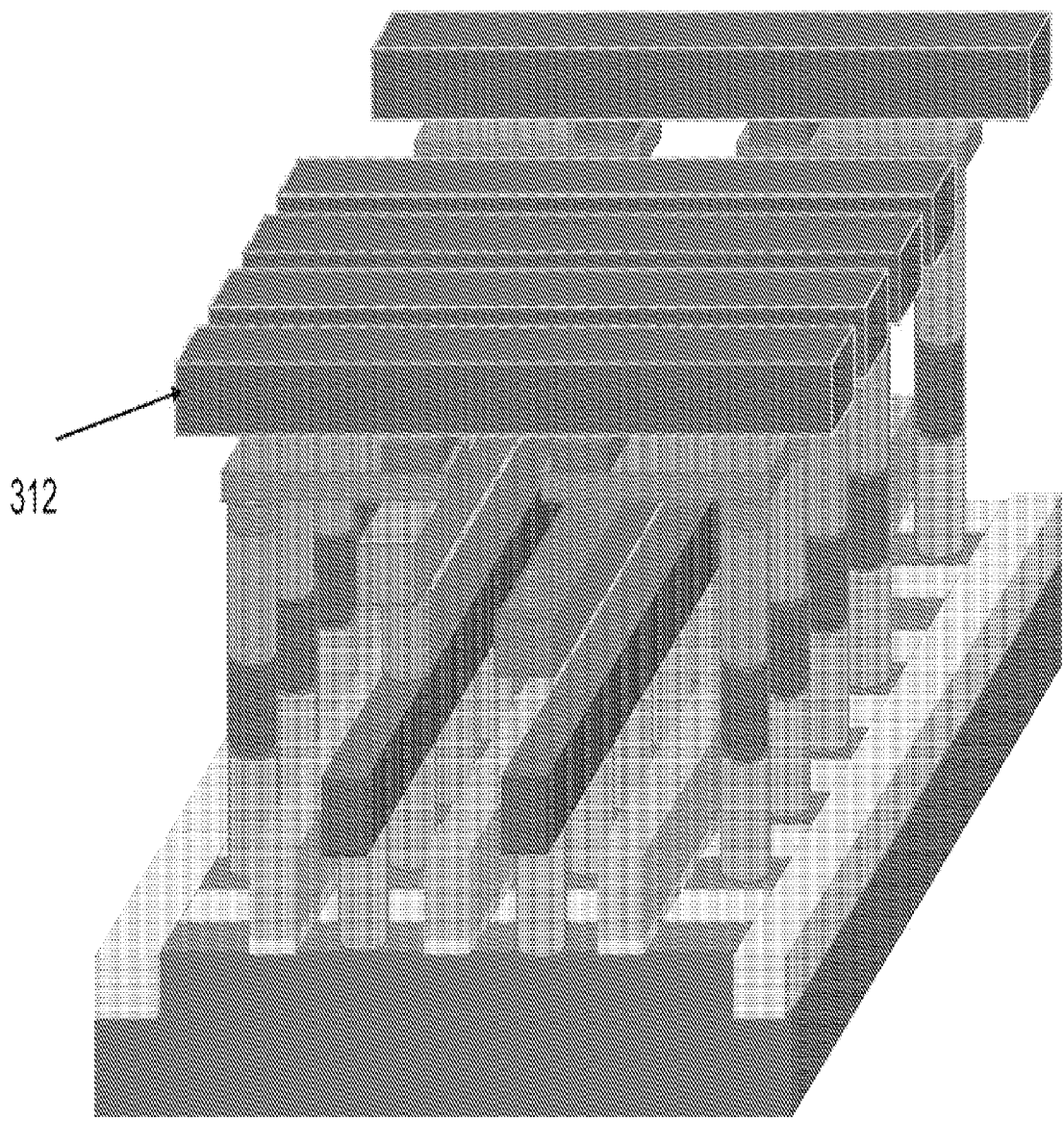
FIG 3.8

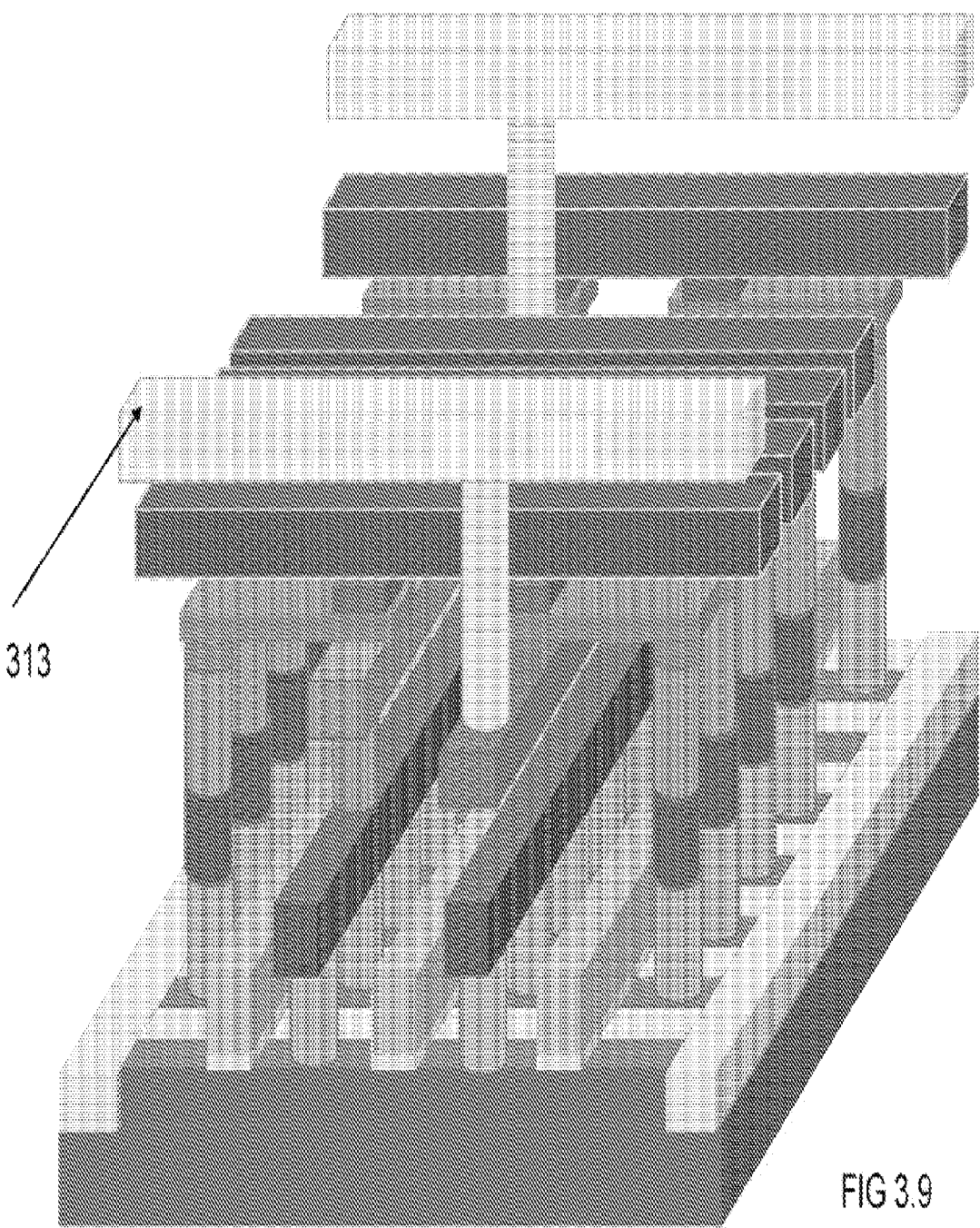
FIG 3.9

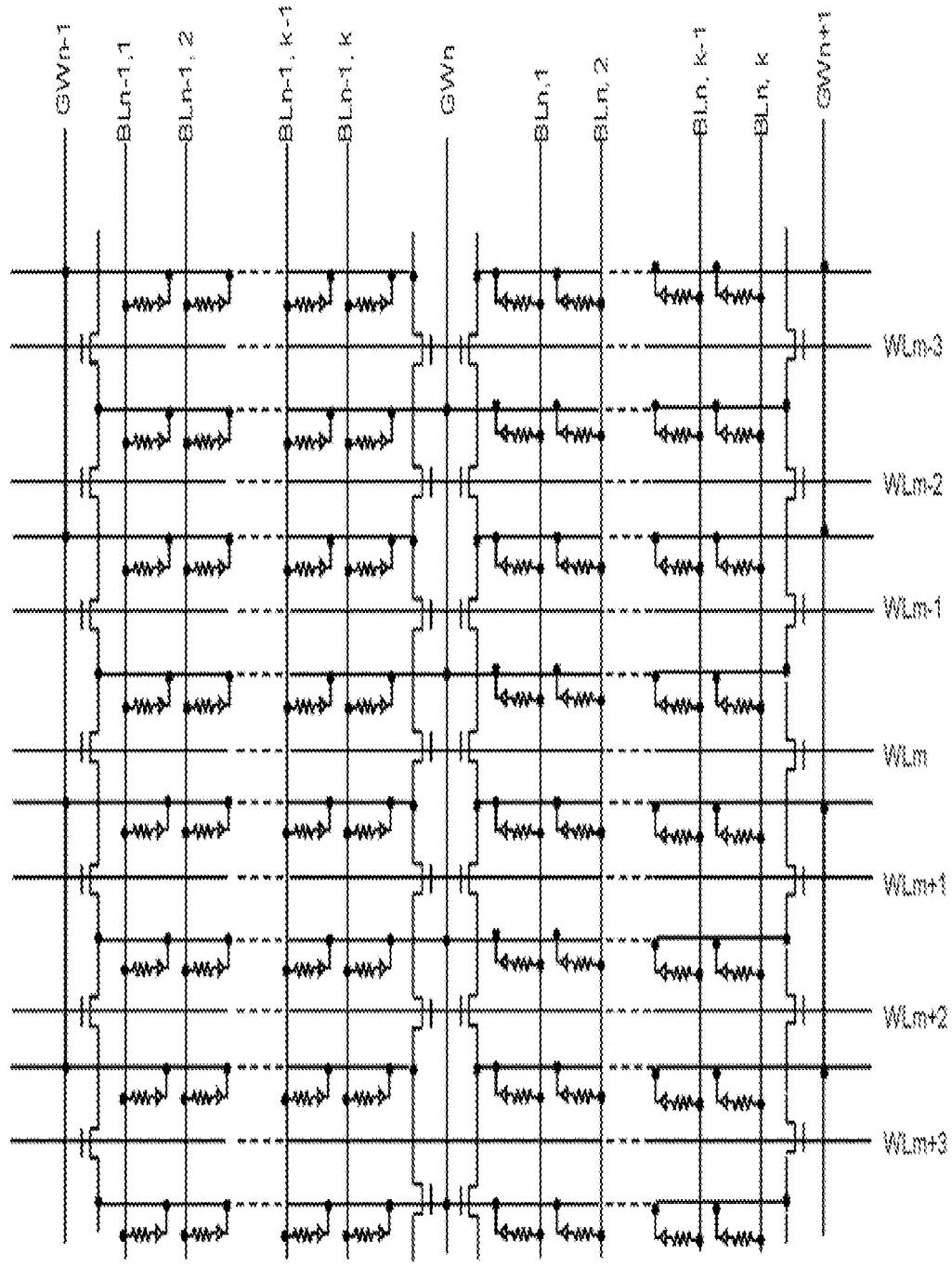
Fig.4.1

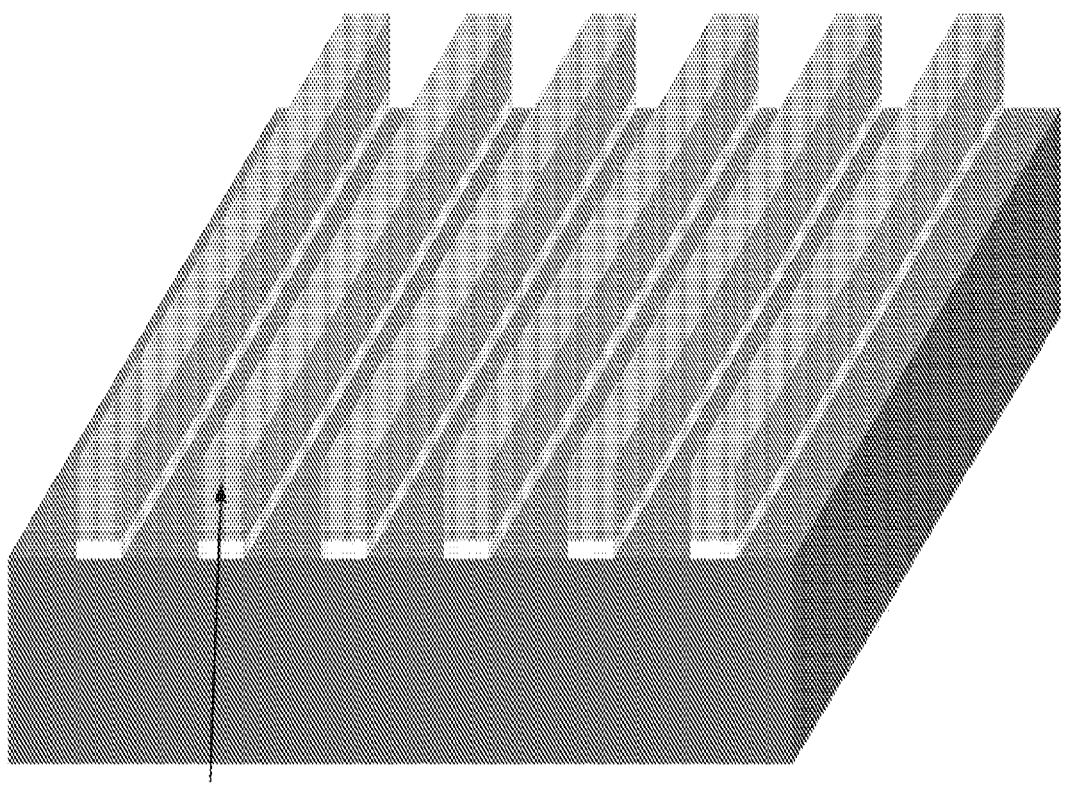
FIG 4.2

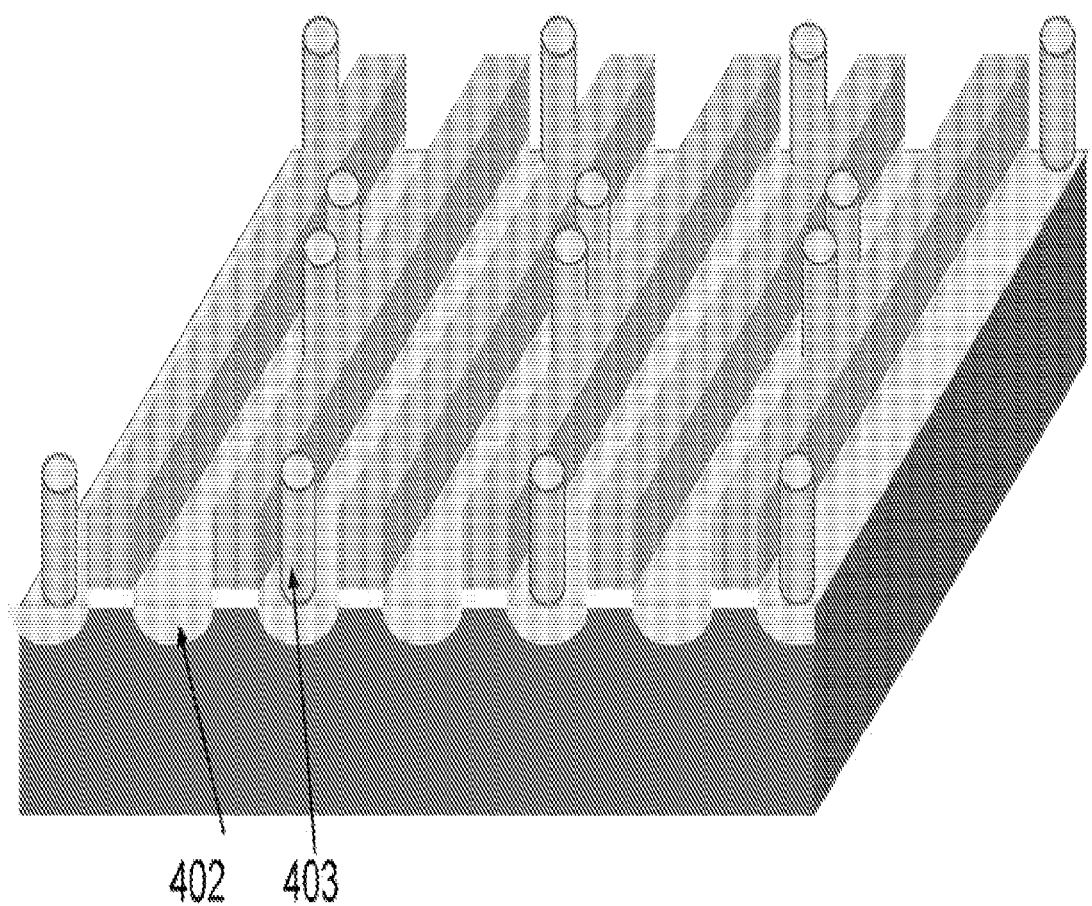
FIG 4.3

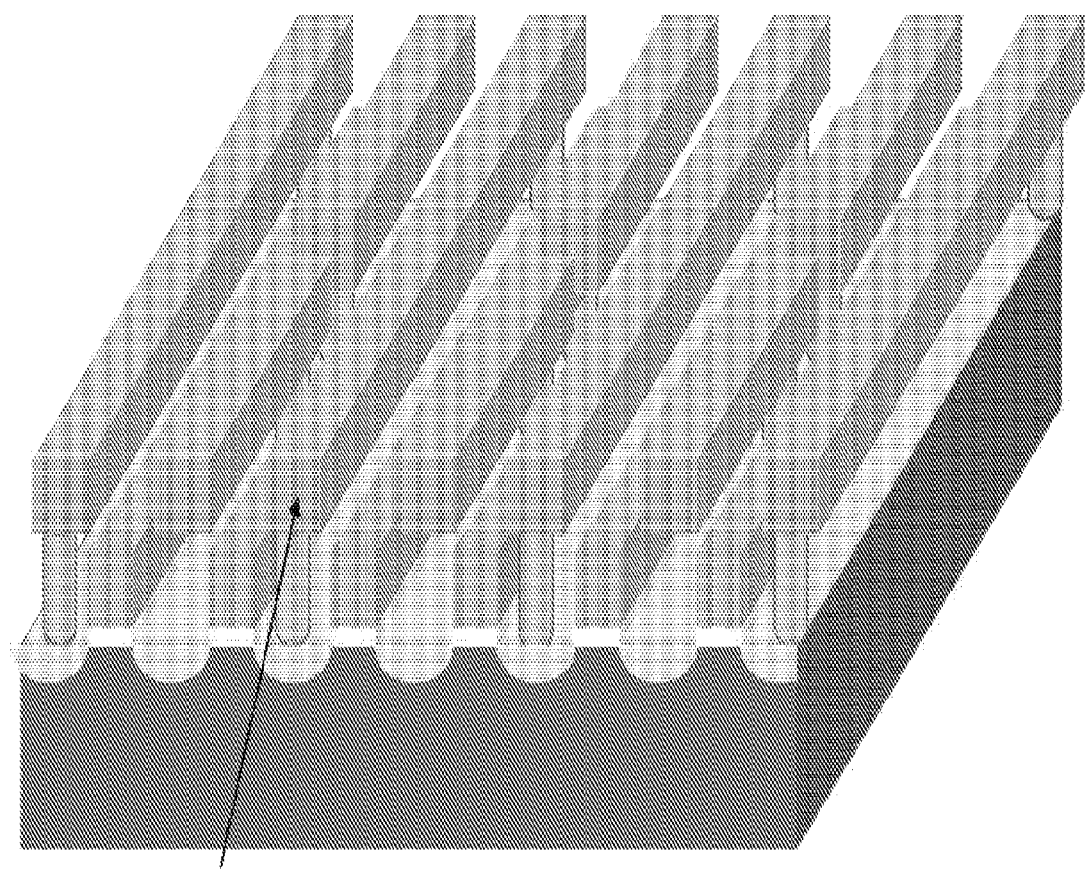
404
FIG 4.4

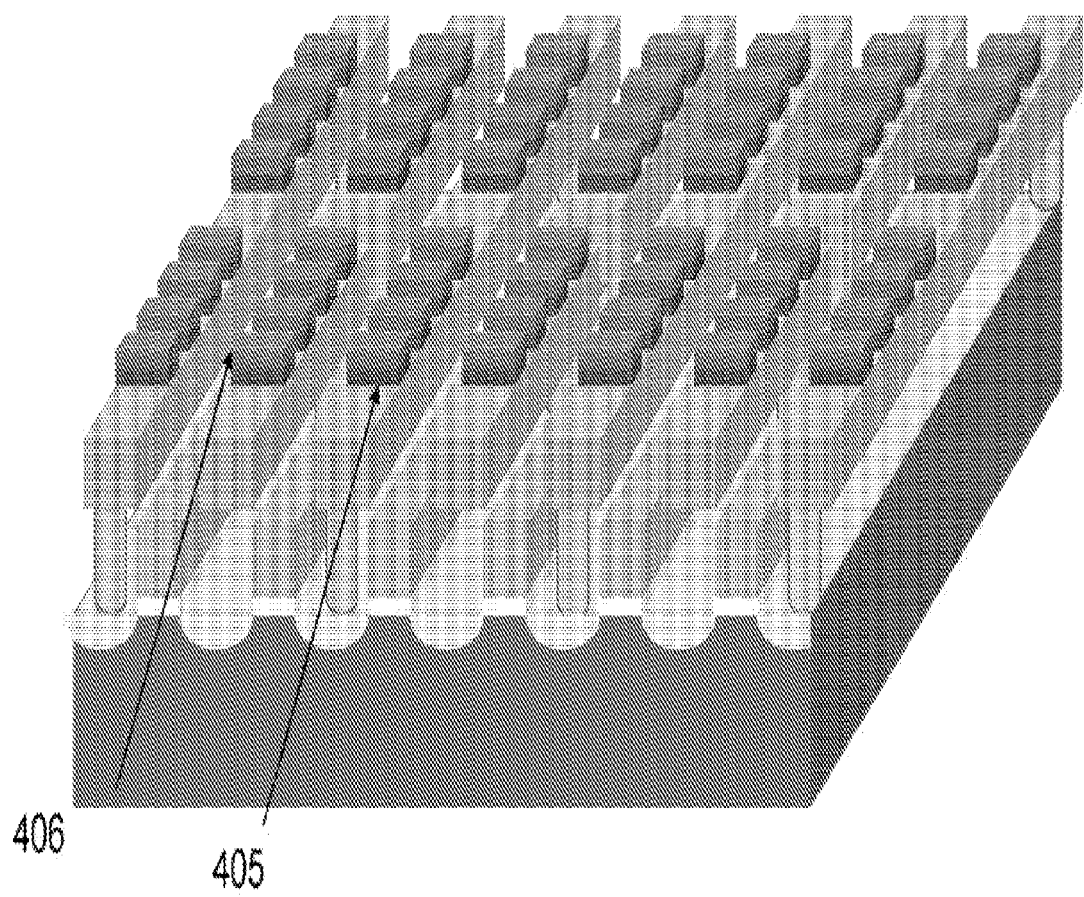
FIG 4.5

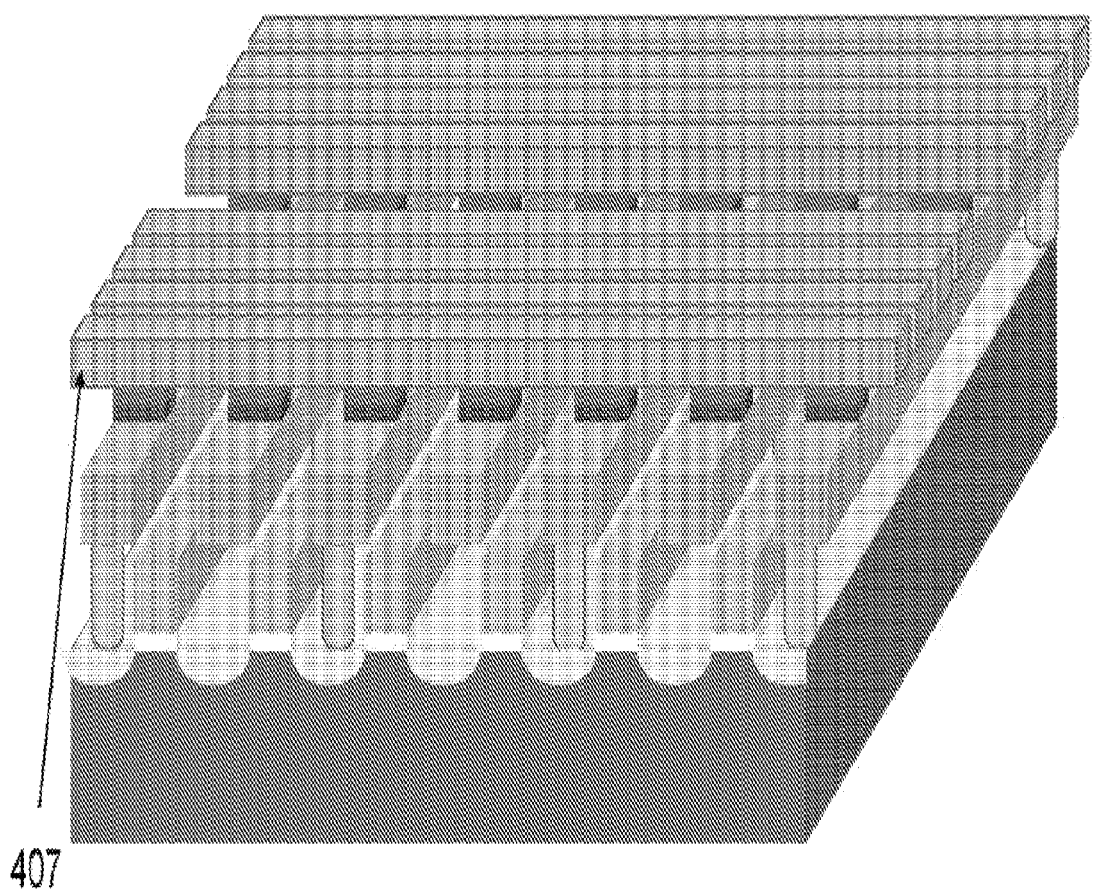
FIG 4.6

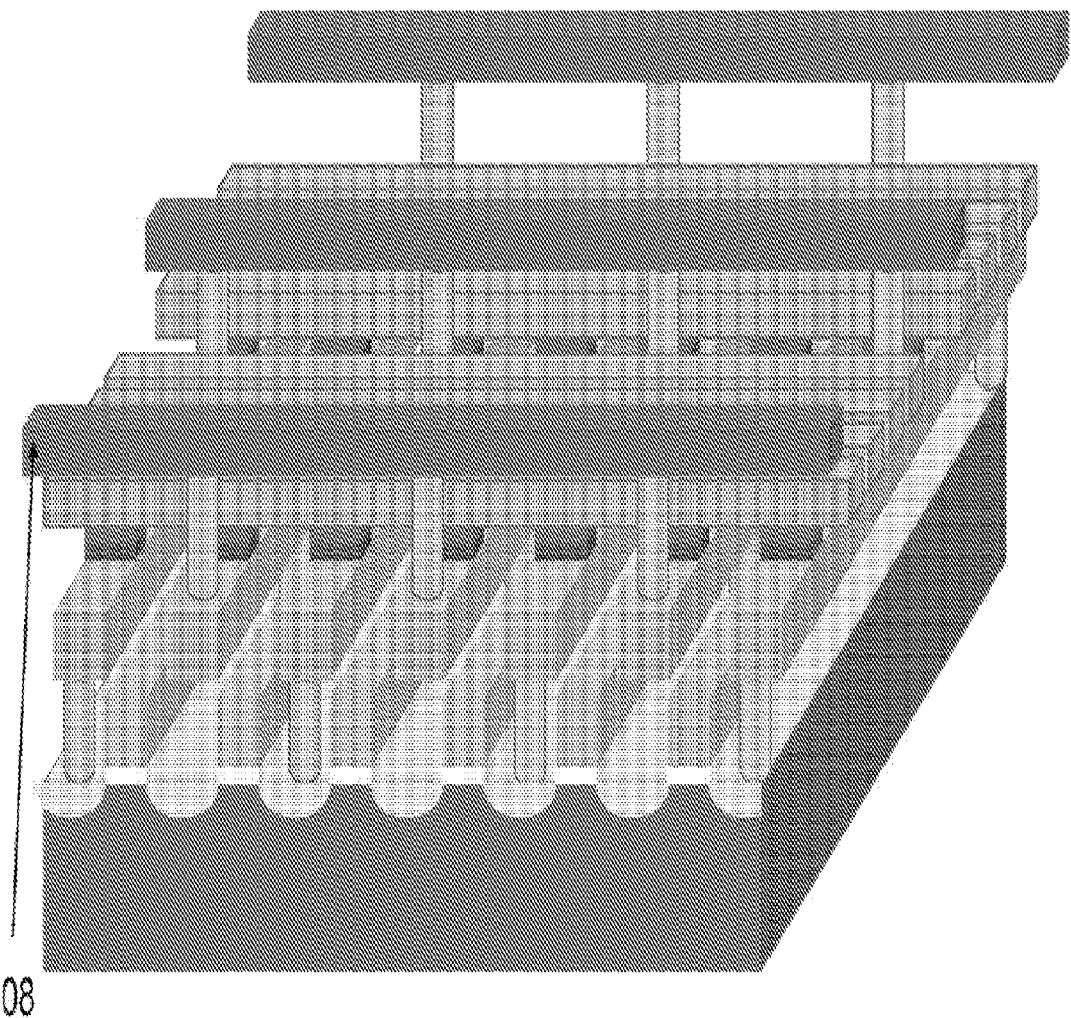
FIG 4.7

MRAM WITH METAL GATE WRITE CONDUCTORS

This application is a continuation of U.S. patent application Ser. No. 13/311,470 filed Dec. 5, 2011, which claims the benefit of priority to U.S. Provisional Patent Application No. 61/419,403 filed Dec. 3, 2010, the entire specification of each of the above applications is incorporated herein by reference.

FIELD

Embodiments of the invention relate to MRAM (Magnetic Random Access Memory) semiconductor devices.

BACKGROUND

A FIMS (Field Induced Magnetic Switching) MRAM cell comprises a MTJ (Magnetic Tunnel Junction) in the form of a stacked memory element, a bit line (BL) metal running on the MTJ in a first direction, a write word line (WWL) running under the MTJ in a second direction crossing the first direction, a read word line (RWL) as a select gate running in the second direction and a read metal wire connecting the MTJ to a selected device. The MTJ is connected to the BL. An insulation layer is disposed between the MTJ and the WWL to prevent current flow through the MTJ during a write operation.

The MTJ is a stack comprising a pinned layer with fixed magnetism, a tunnel layer and a free layer. Two orthogonal currents carried by the write word line and the bit line manipulate magnetic fields in the free layer. When the direction of the free layer field coincides with that of the pinned layer, tunnel resistance of the MTJ becomes low. When the direction is opposite, the resistance becomes high. A memory high or low state is defined as high or low resistance of the MTJ element. A read word line (RWL) selects a column to be read.

There are two word lines, RWL and WWL, in a unit cell. The RWL or WWL play no role during "write" or "read" operations. Thus, having a RWL and a WWL is not only inefficient but also limits the miniaturization of a memory cell. WWL is patterned in the second or upper metals. A metal stud to connect the read metal is also formed at the WWL metal level. There are two sets of metal and space along bit line direction, and one set along the word line direction. Since the MTJ should be within widths of BL and WWL, overlay margin is added to widths of BL and WWL. Minimum feature size of $2^{nd}$ or upper metal width is 1.5 to 2 times larger than gate width. The unit cell area becomes 30 to 40 $F^2$, where F is minimum feature size of its technology.

Another serious issue with the conventional MRAM cell is that the write current to switch a vector of free layer is not scaled down with miniaturization. Thus, the problem of electro migration arises from high current density,

SUMMARY

According to a first aspect of the invention, there is provided a magnetic random access (MRAM) cell, comprising: a magnetic bit; and write conductors defined by conductors patterned in a second metal layer above the magnetic bit; and a gate formed below the magnetic bit between a source and a drain.

According to a second aspect of the invention, there is provided a magnetic random access (MRAM) device, comprising: a plurality of MRAM cells, wherein each MRAM cell comprises a magnetic bit, and write conductors defined by conductors patterned in a second metal layer above the magnetic bit; and a gate formed below the magnetic bit between a source and a drain; and addressing circuits to address the MRAM cells.

According to a third aspect of the invention, there is provided a method for operating a magnetic random access (MRAM) device, the method comprising: selecting a MRAM cell for writing to; and writing to the selected MRAM cell by passing a write current through a gate between a source and a drain below the MRAM cell.

Other aspects of the invention will become apparent from the written description below.

BRIEF DESCRIPTION OF THE DRAWINGS

FIGS. 1.1 to 1.7 illustrate various process steps in the manufacturing of the base line structure of FIG. 1.

FIGS. 2.1 to 2.3 illustrate various process steps in the manufacturing of the metal gate MRAM of FIG. 2.

FIG. 3.1 is an electrical diagram for the MRAM array architecture of FIG. 3.

FIGS. 3.2 to 3.9 illustrate various process steps in manufacturing the MRAM array architecture of FIG. 3.

FIG. 4.1 is an electrical diagram for the MRAM array with a PIN diode structure shown in FIG. 4.

FIGS. 4.2 to 4.7 illustrates various process steps to fabricate the MRAM array with a PIN diode structure shown in FIG. 4.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the present invention disclose a MRAM device in which the write conductors used for write operations are defined by metal conductors in a second metal layer (M2) and metal gates of each memory cell. This obviates the need for defining write conductors using second and third metal layers and results in a more compact MRAM array.

Figure 1:
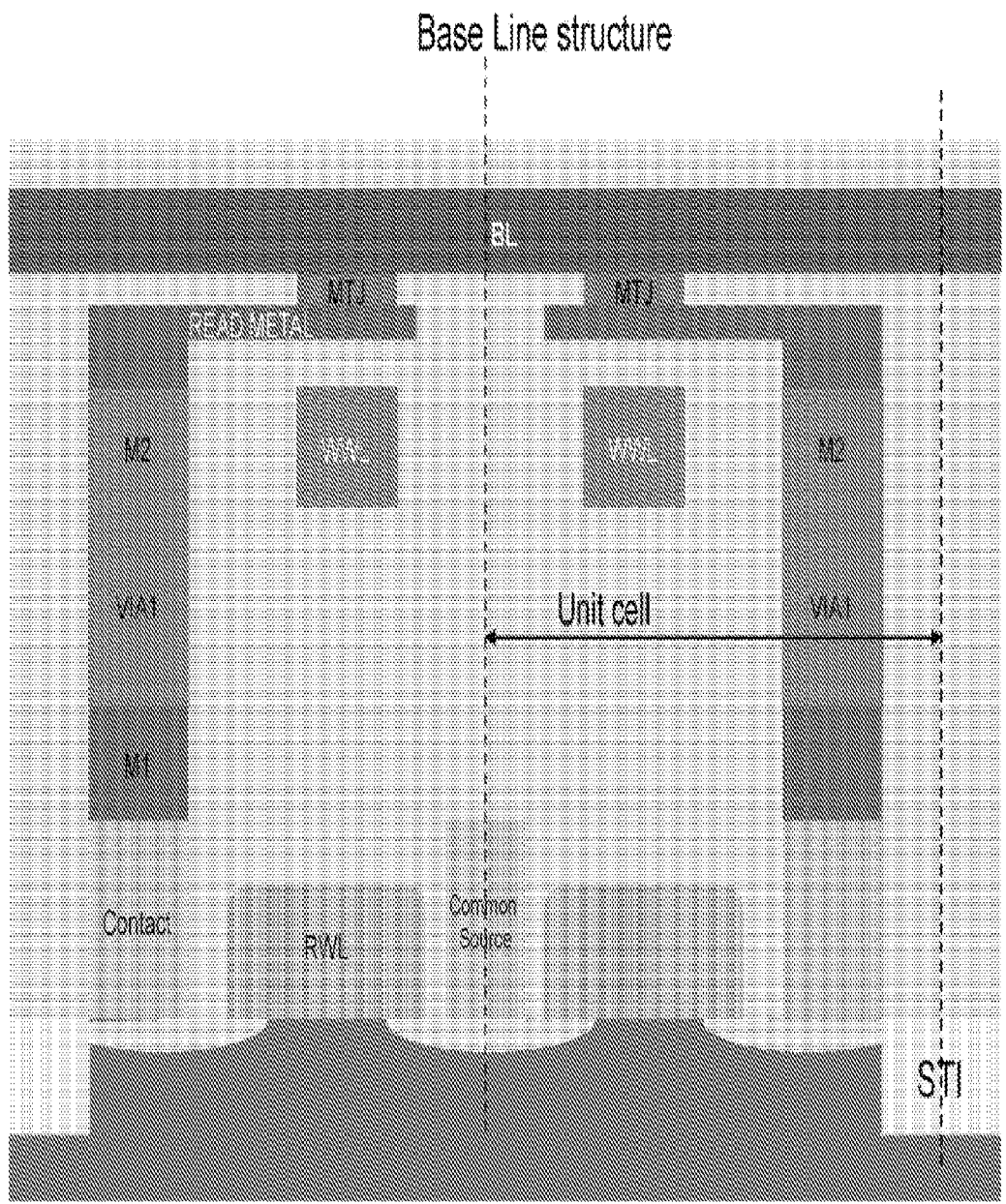
FIG. 1 is a cross-sectional representation of base line structure, depicting an MRAM cell in accordance with the prior art.

FIG. 1 shows a cross-section through a base line structure that is defined by a conventional MRAM cell architecture. FIGS. 1.1 to 1.7 illustrate various process steps in the manufacturing of the base line structure of FIG. 1.

As shown in FIG. 1.1, STI (shallow trench isolation) 101 is formed in silicon substrate 100 with a conventional process. An active area array bounded by STI runs straightly along a first direction to define a cell area. The edges are also isolated by STI. Conventional MOS gate consisting of gate oxide 102 and gate electrode 103 is placed along a second direction across the active area array as shown in FIG. 1.2. Source and drain species are implanted to form source and drain regions 104 shown in FIG. 1.3 with conventional CMOS process followed by activation anneal and silicidation process. Dielectric is deposited and planerized by CMP (chemical mechanical polish). Contact studs 105 are placed on the source and drain regions as shown in FIG. 1.3 by using conventional lithography, etch, tungsten deposition and CMP process. At first metal step as shown in FIG. 1.4, source contact studs are connected to first metal line 107 to make them a common source line. Metal pillars 106 are stacked on each bit (drain) contact to extend to a MTJ memory unit (yet to be formed).

A pillar 108 of via 1 and second metal is also stacked on the bit stack as shown in FIG. 1.5. A WWL (write word line) 109 is patterned at a second metal level. The pillar 108 and WWL 109 are patterned by conventional damascene process and planerized, followed by a dielectric film deposition. The dielectric film may be thinner than 100 nm. Read metal 110 and MTJ film stack are deposited subsequently. The MTJ and read metal stack film is patterned with a two mask step. The first mask corresponds to the rectangular pattern 110 of the read metal. The MTJ and read metal stack is etched with the first mask. A second mask is applied along a second direction across the rectangular shape array. The etching with second mask is stopped at the read metal surface to make each MTJ cell 111. Dielectric film is deposited and each via is opened over each MTJ cell 111. BL metal is deposited and BL 112 is patterned along a first direction as shown in FIG. 112. A pad metal process is then performed to complete the wafer process.

Figure 2:
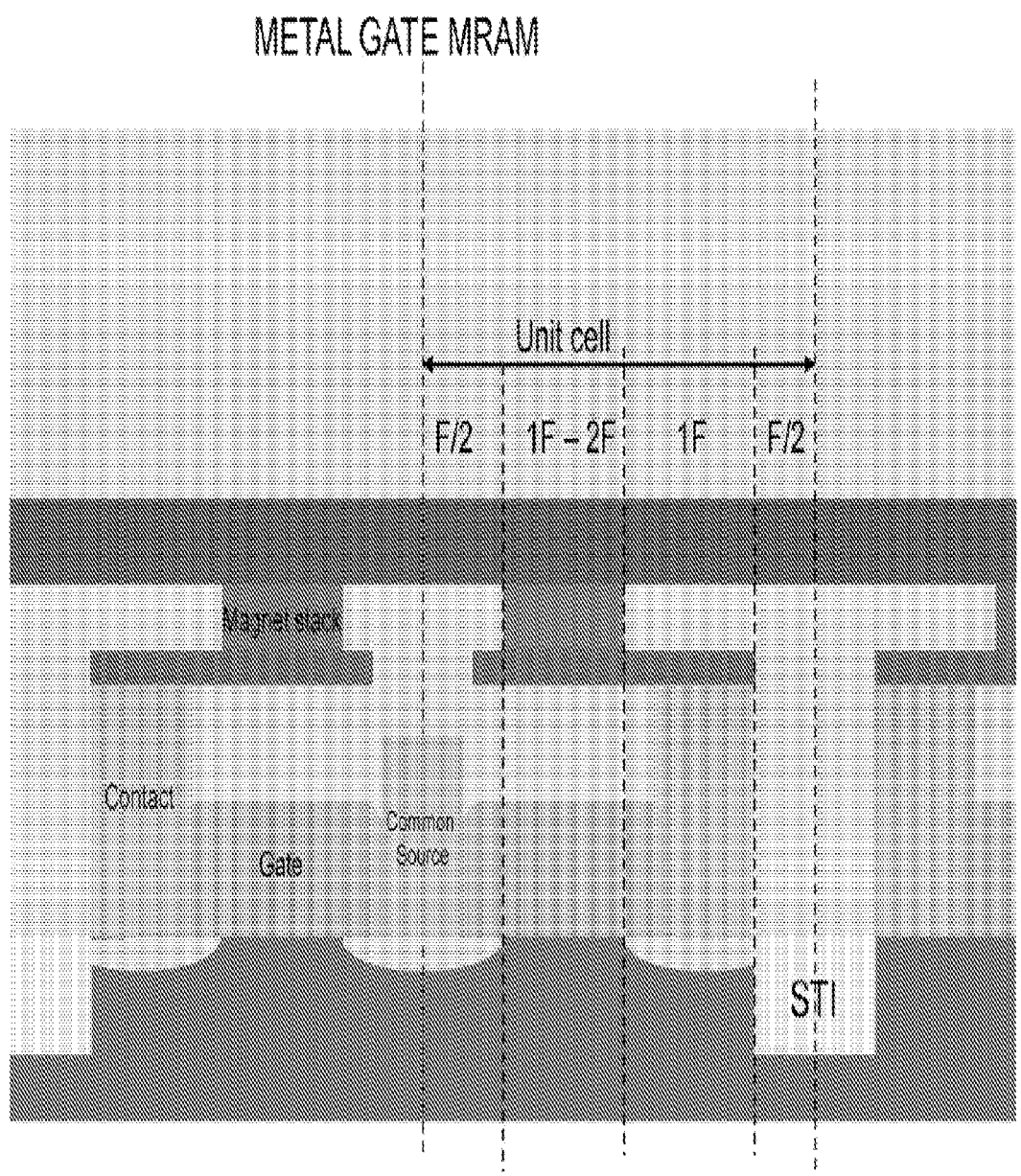
FIG. 2 is a cross-sectional representation of metal gate MRAM in accordance with one embodiment of the invention.

FIG. 2 is a cross-sectional representation of metal gate MRAM in accordance with one embodiment of the invention. FIGS. 2.1 to 2.3 illustrate various process steps in the manufacturing of the metal gate MRAM of FIG. 2.

With the metal gate MRAM shown in FIG. 2, the read gate electrode works also as a write word line. The MTJ memory cell is placed right over the read gate electrode. The structure over the MTJ is same as that of base line structure describe above. Since a large current is required for the write word line, the resistance should be low. Thus, a metal gate is preferred.

Up to the gate process, the fabrication method is same as with the base line structure. The gate electrode 203 in FIG. 2.1 comprise a metal, in one embodiment. The common source 205 in FIG. 2.2 is formed by using a local wire process. The read lead metal 210 and MTJ 211 is patterned right over the gate as shown in FIG. 2.3.

Figure 3:
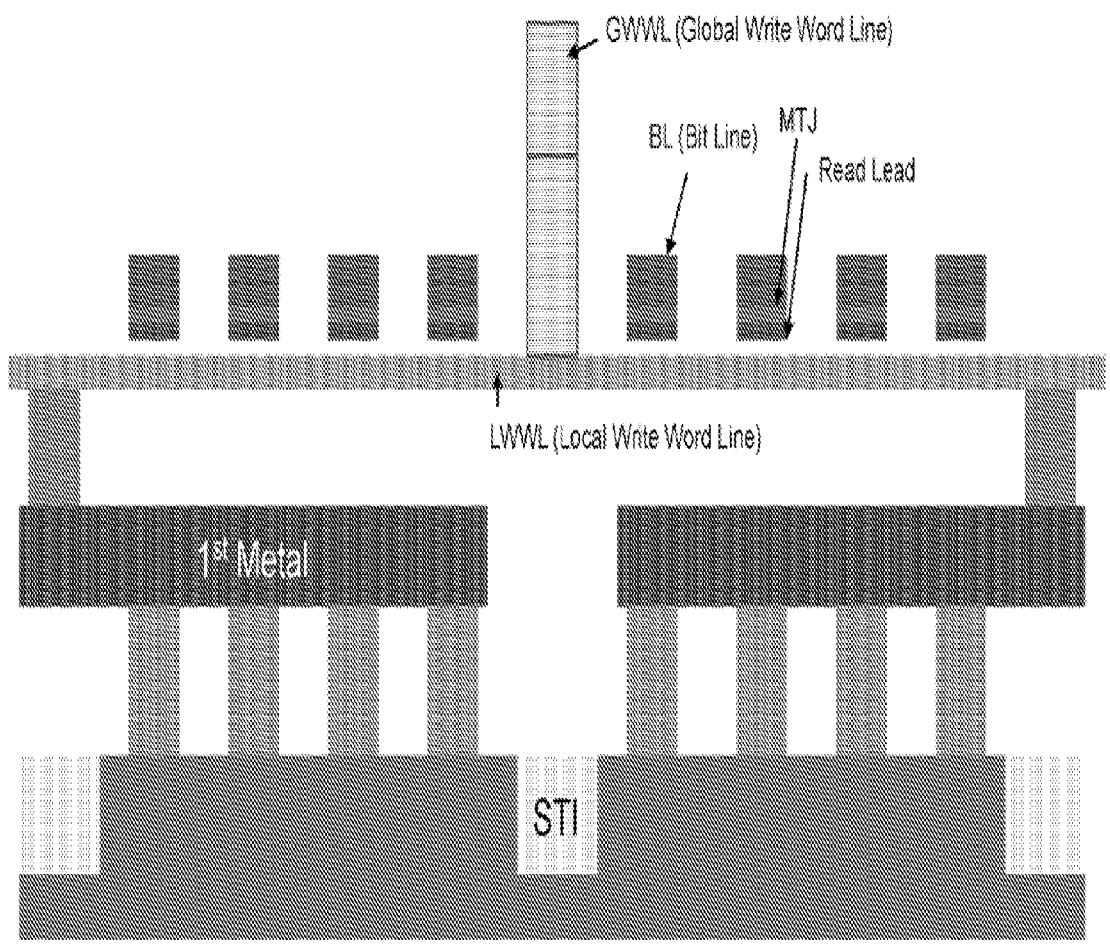
FIG. 3 is a cross-sectional representation of an MRAM array architecture with a thin local metal structure, in accordance with one embodiment of the invention.

FIG. 3 is a cross-sectional representation of an MRAM array architecture with a thin local metal structure, in accordance with one embodiment of the invention. FIG. 3.1 is an electrical diagram for the MRAM array architecture of FIG. 3.

The thin local metal is used for the write word line to increase current density. A Global Write Word Line (GWWL) runs along a first direction, parallel to the Bit Line. A Local Write Word Line (LWWL) is split into two ways from the GWWR in a second direction. The LWWR runs under 8 or 16 cells per side. The LWWR is connected a write transistor.

The STI 301 and active area 300 in FIG. 3.2 has the same structure as with base line structure of FIG. 1. Two memory cells can fit between the STI along the first direction. A write gate 304 is added between two read gates 303 as shown in FIG. 3.3, followed by conventional source and drain process, silicidation process, and contact process. Contact stud 305 is placed on every bit as in FIG. 3.4. The contact stud on drain side of read gate is extended by Metal 1 pillar 307 to connect read metal. Contact stud on both sides of the word gate is connected by first metal 306 as shown in FIG. 3.5. The first metal line 306 is connected LWWL 308 in FIG. 3.6. Read bit stack is extended by pillar 309. The read metal 310 and MTJ 311 in FIG. 3.7 are patterned in the same way as base line structure. BL metal 312 connects the MTJ along 1st direction as shown in FIG. 3.8. GWWL 313 stitches every other LWWL along the first direction as shown in FIG. 3.9.

Figure 4:
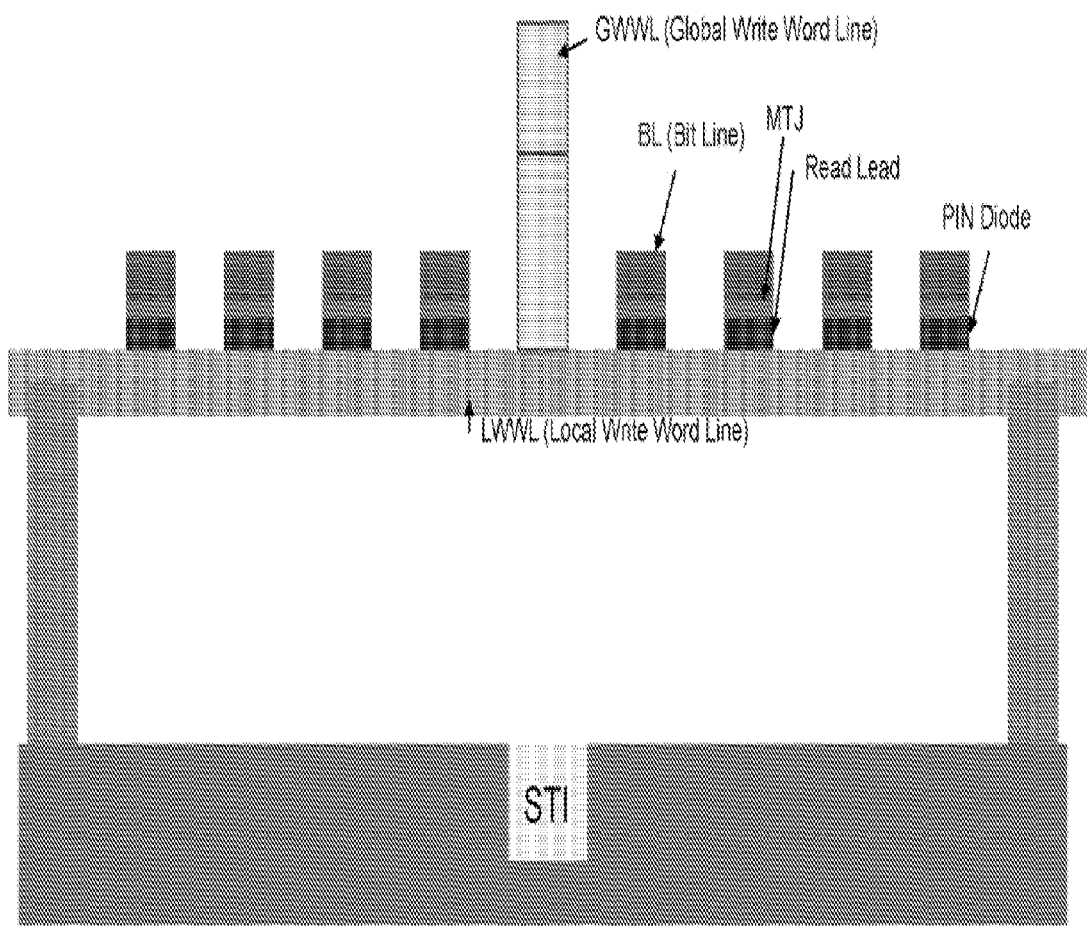
FIG. 4 is a cross-sectional representation of an MRAM array with a PIN diode structure, in accordance with one embodiment of the invention.

FIG. 4 is a cross-sectional representation of an MRAM array with a PIN diode structure, in accordance with one embodiment of the invention. FIG. 4.1 is an electrical diagram for the MRAM array with a PIN diode structure shown in FIG. 4. FIGS. 4.2 to 4.7 illustrates various process steps to fabricate the MRAM array with a PIN diode structure shown in FIG. 4. In the embodiment of FIG. 4, there is a "PIN" diode under the MTJ as can be seen. A read transistor attached to each MTJ cell is not necessary any more. The structure can miniaturize the unit cell area drastically. LWWL is split into two ways from GWWL. Pillar PIN diode is patterned on the LWWL and MTJ is patterned on PIN. LWWL is connected to bit diffusion at the end.

As shown in FIG. 4.2, write transistor lines 401 are patterned to select write cell and flow write current. The contact stud 403 as shown in FIG. 4.3 is formed to connect to LWWL. LWWL 404 is patterned as corm as in FIG. 4.4. PIN layers 405 and MTJ stack are 406 are deposited and patterned on the LWWL 404 as pillar as shown in FIG. 4.5. Bit line metal 407 connects MTJ along the first direction as in FIG. 4.6. LWWL is stitched by GWWL 408 as shown in FIG. 4.7.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A magnetic random access memory (MRAM) cell, comprising:
    a source and a drain formed in a substrate;
    a read/write gate electrode formed on the substrate between the source and drain and configured to operate as both a read word line electrode and a write word line electrode;
    a drain contact stud connected to the drain;
    a source lead connected to the source;
    a read metal lead of a read metal layer formed above the read/write gate electrode, drain contact, and source lead, wherein the read metal lead couples the drain contact stud to the read/write gate electrode;
    a magnetic bit formed on the read metal lead and above the read/write gate electrode; and
    a write conductor of a write metal layer formed above the magnetic bit, wherein the write conductor is coupled to the magnetic bit.

2. The MRAM cell of claim 1, wherein the magnetic bit comprises a Magnetic Tunnel Junction (MTJ) stack.

3. The MRAM cell of claim 2, wherein the MTJ stack comprises a pinned layer with fixed magnetism, a tunnel layer, and a free layer having a magnetic field state configured to be manipulated by the read/write gate electrode.

4. The MRAM cell of claim 1, wherein the read/write gate electrode comprises metal.

5. The MRAM cell of claim 1, further comprising a gate oxide formed between the read/write gate and the substrate.

6. A magnetic random access memory (MRAM) device, comprising:
   a first global write word line;
   a second global write word line;
   a plurality of first local write word lines coupled to the first global write word line; and
   a plurality of second local write word lines coupled to the second global write word line;
   wherein each local write word line of the first and second local write word lines has a corresponding plurality of magnetic bits;
   wherein each magnetic bit of the plurality of magnetic bits comprises an associated read line and an associated bit line;
   wherein each magnetic bit comprises a Magnetic Tunnel Junction (MTJ) stack; and
   wherein each MTJ stack has an associated write transistor and an associated read transistor.

7. The MRAM device of claim 6, wherein each MTJ stack comprises a pinned layer with fixed magnetism, a tunnel layer, and a free layer having a magnetic field state configured to be manipulated by its associated local write word line.

8. The MRAM device of claim 6, wherein each MTJ stack has an associated diode which couples the MTJ stack to its associated read line.

9. The MRAM device of claim 6, wherein each local word write line of the first and second word write lines is coupled to a plurality of write transistors.

10. The MRAM device of claim 6, further comprising:
    a plurality of write transistors; and
    a metal line defined by conductors patterned in a metal layer above the plurality of write transistors;
    wherein the metal line is coupled to a source of each write transistor of the plurality of transistors; and
    wherein a local write line of the first local write lines is coupled to the plurality of write transistors via the metal line.

11. The MRAM device of claim 6, wherein:
    each first local write word line of the plurality of first local write word lines is thinner than the first global write word line; and
    each second local write word line of the plurality of second local write word lines is thinner than the second global write word line.

* * * * *